(12) United States Patent
Parat et al.

(10) Patent No.: US 11,322,508 B2
(45) Date of Patent: May 3, 2022

(54) FLASH MEMORY COMPONENTS AND METHODS

(71) Applicant: Intel Corporation, Santa Clara, CA (US)

(72) Inventors: Krishna Parat, Palo Alto, CA (US); Richard Fastow, Cupertino, CA (US)

(73) Assignee: Intel Corporation, Santa Clara, CA (US)

(*) Notice: Subject to any disclaimer, the term of this patent is extended or adjusted under 35 U.S.C. 154(b) by 24 days.

(21) Appl. No.: 15/996,116

(22) Filed: Jun. 1, 2018

(65) Prior Publication Data

US 2019/0043875 A1 Feb. 7, 2019

(51) Int. Cl.
| | |
|---|---|
| *H01L 27/11556* | (2017.01) |
| *G11C 16/04* | (2006.01) |
| *H01L 21/764* | (2006.01) |
| *H01L 27/11524* | (2017.01) |
| *H01L 27/1157* | (2017.01) |
| *H01L 27/11582* | (2017.01) |

(52) U.S. Cl.
CPC .... *H01L 27/11556* (2013.01); *G11C 16/0408* (2013.01); *G11C 16/0466* (2013.01); *G11C 16/0483* (2013.01); *H01L 21/764* (2013.01); *H01L 27/1157* (2013.01); *H01L 27/11524* (2013.01); *H01L 27/11582* (2013.01)

(58) Field of Classification Search
CPC ............ H01L 27/11556; H01L 21/764; H01L 27/1157; H01L 27/11524; H01L 27/11582; G11C 16/0483; G11C 16/0466; G11C 16/0408
See application file for complete search history.

(56) References Cited

U.S. PATENT DOCUMENTS

| | | | |
|---|---|---|---|
| 8,847,302 B2 * | 9/2014 | Alsmeier | H01L 29/7926 257/316 |
| 9,437,606 B2 * | 9/2016 | Makala | H01L 27/0688 |

(Continued)

OTHER PUBLICATIONS

Borenstein et al.; "A New Ultra-Hard Etch-Stop Layer for High Precision Micromachining"; Proceedings of the IEEE International Conference on Micro Electro Mechanical Systems (MEMS); (Feb. 1999); pp. 205-210; In Conference: Micro Electro Mechanical Systems, 1999; MEMS '99. Twelfth IEEE International Conference on Micro Electro Mechanical Systems; <doi: 10.1109/MEMSYS. 1999.746810 >.

(Continued)

*Primary Examiner* — Benjamin Tzu-Hung Liu
(74) *Attorney, Agent, or Firm* — Alliance IP, LLC

(57) ABSTRACT

Flash memory technology is disclosed. In one example, a flash memory component can include a plurality of conductive layers vertically spaced apart from one another and separated by voids, each of the plurality of conductive layers forming a word line. The memory component can also include a vertically oriented conductive channel extending through the plurality of conductive layers. In addition, the flash memory component can include a plurality of memory cells coupling the plurality of conductive layers to the conductive channel. Each word line can be associated with one of the plurality of memory cells. Associated devices, systems, and methods are also disclosed.

13 Claims, 16 Drawing Sheets

(56) References Cited

U.S. PATENT DOCUMENTS

| | | | |
|---|---|---|---|
| 2010/0207193 A1* | 8/2010 | Tanaka | H01L 27/11582 |
| | | | 257/324 |
| 2016/0005746 A1* | 1/2016 | Lee | G11C 16/06 |
| | | | 365/185.18 |
| 2016/0049423 A1* | 2/2016 | Yoo | H01L 27/11565 |
| | | | 257/324 |
| 2018/0033798 A1* | 2/2018 | Baraskar | H01L 29/40117 |
| 2019/0067320 A1* | 2/2019 | Cho | H01L 23/5226 |
| 2020/0013791 A1* | 1/2020 | Or-Bach | H01L 29/42332 |

OTHER PUBLICATIONS

Borenstein et al.; "Silicon Germanium Epitaxy: A New Material for MEMS"; Materials Research Society Symposium; (2001); pp. EE7.4.1-EE7.4.6; vol. 657.

Ding et al.; "Anisotropic Fluorocarbon Plasma Etching of Si / SiGe Heterostructures"; Journal of Vacuum Science & Technology B: Microelectronics and Nanometer Structures Processing, Measurement, and Phenomena; (Mar. 13, 2007); pp. 404-409; vol. 25, Issue 2; <doi: 10.1116/1.2712199 >.

Leinenbach et al.; "A Novel Sacrificial Layer Technology Based on Highly Selective Etching of Silicon-Germanium in CLF3"; Proceedings of the IEEE International Conference on Micro Electro Mechanical Systems (MEMS); (Feb. 2007); pp. 65-68; In Conference: Micro Electro Mechanical Systems, 2007; MEMS; IEEE 20$^{th}$ International Conference on Micro Electro Mechanical Systems; <doi: 10.1109/MEMSYS.2007.4433014 >.

Oehrlein et al.; "Selective Dry Etching of Silicon with Respect to Germanium"; Applied Physics Letters; (Apr. 9, 1990); pp. 1436-1438; vol. 56, Issue 15; <doi: 10.1063/1.102490 >.

\* cited by examiner

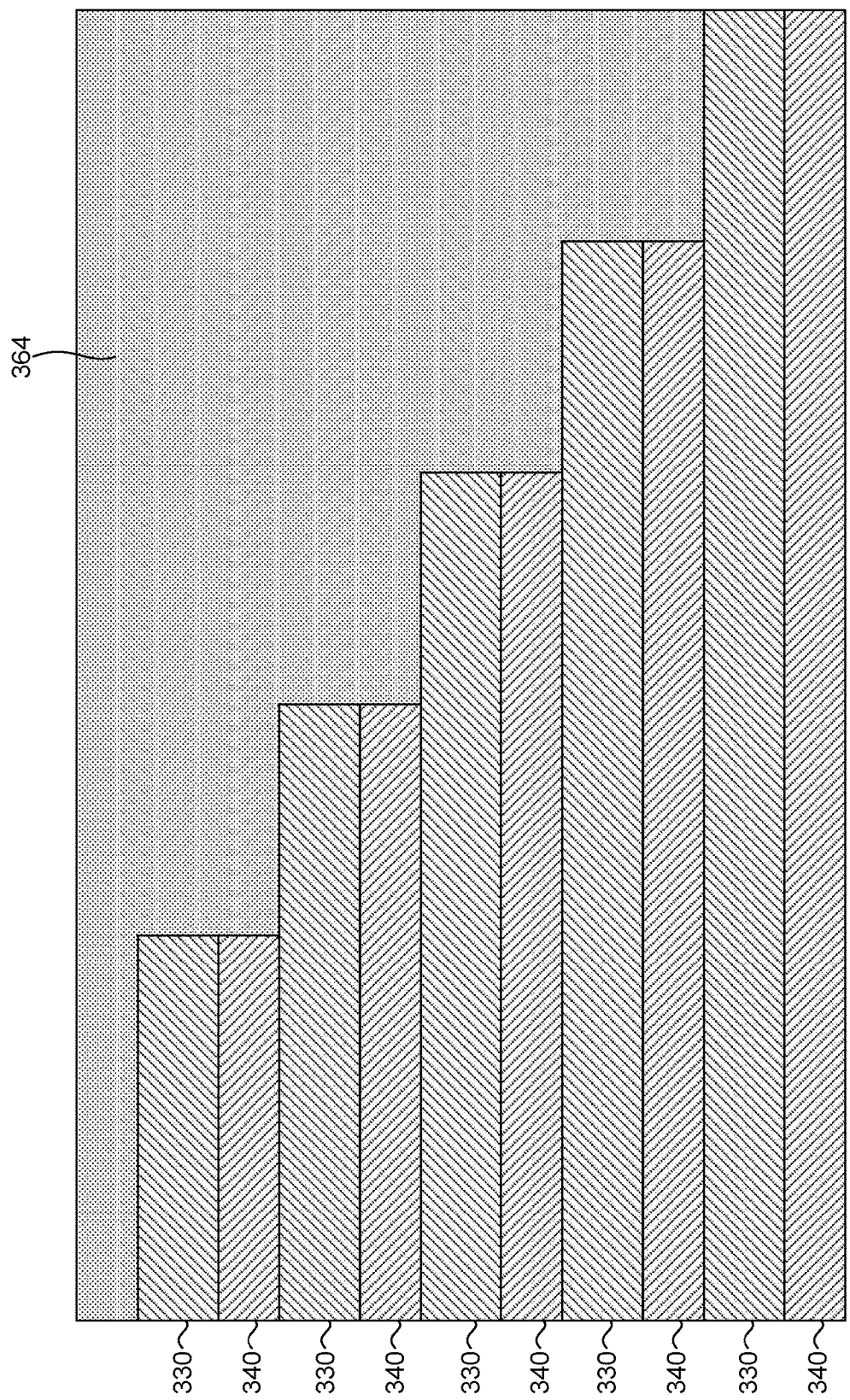

FLASH MEMORY COMPONENTS AND METHODS

TECHNICAL FIELD

Embodiments described herein relate generally to computer memory, and more particularly to flash memory devices.

BACKGROUND

Flash memory is a type of computer memory that utilizes floating gate transistors such as metal-oxide-semiconductor field-effect transistors, as memory cells to store information. Principle among commercialized flash memory are NAND and NOR memory types. In NAND memory the cells are arranged in an array such that a control gate of each memory cell in a row is connected to form an access line, such as a word line. Columns of the array include strings (often termed NAND strings) of memory cells connected together in series, source to drain, between a pair of select lines, a source select line and a drain select line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

BRIEF DESCRIPTION OF THE DRAWINGS

Technology features and advantages will be apparent from the detailed description which follows, taken in conjunction with the accompanying drawings, which together illustrate, by way of example, various technology embodiments; and, wherein:

FIGS. 6A-6G illustrate methods for making a flash memory component in accordance with another example embodiment;

Figure 1:
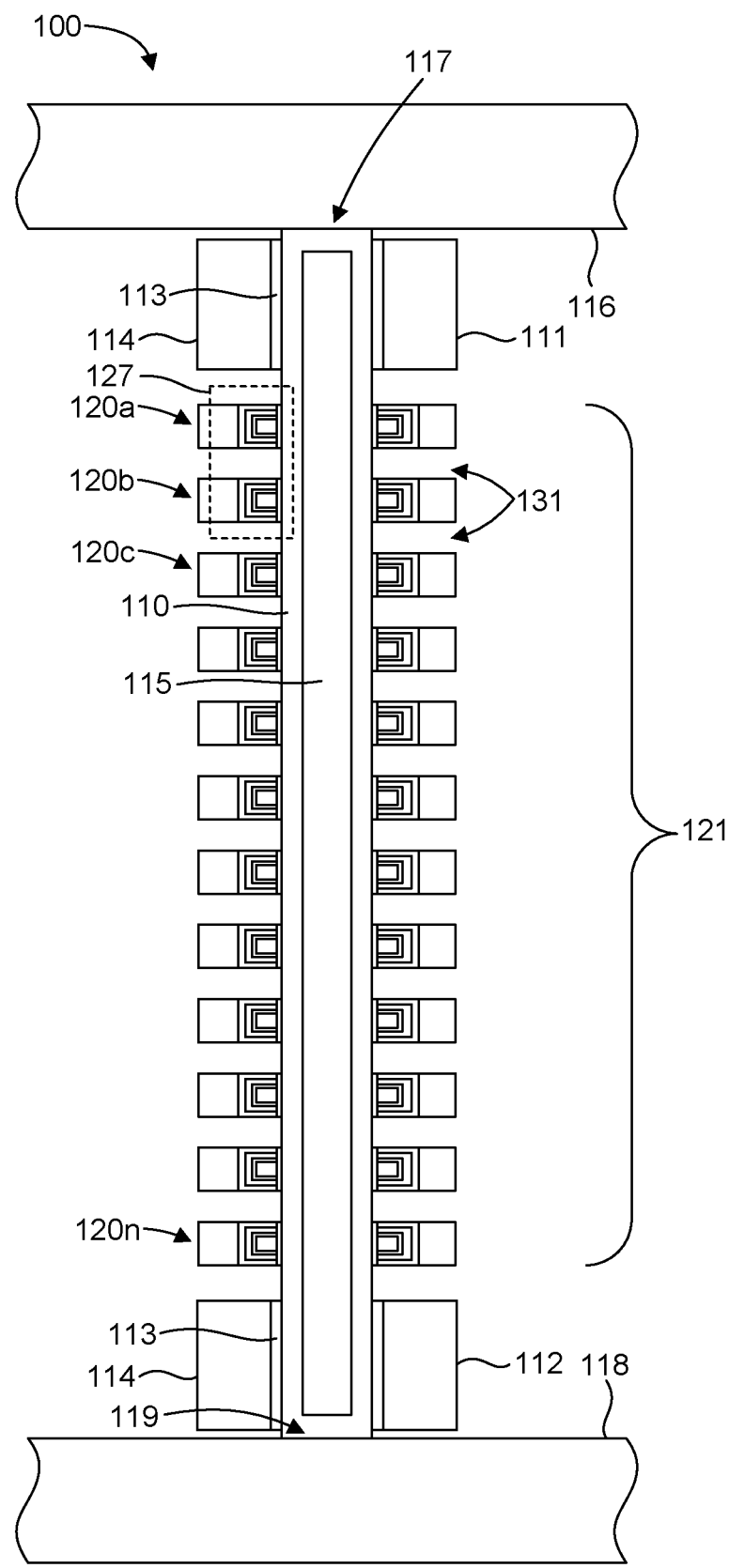
FIG. 1 illustrates a portion of a flash memory component in accordance with an example embodiment.

Reference will now be made to the exemplary embodiments illustrated, and specific language will be used herein to describe the same. It will nevertheless be understood that no limitation of the disclosure scope or to specific technology embodiments is thereby intended.

DESCRIPTION OF EMBODIMENTS

Before technology embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" include express support for plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" structures or elements are in physical contact with one another and are attached. Objects described herein as being "adjacent to" each other may be in physical contact with each other, in close proximity to each other, or in the same general region or area as each other, as appropriate for the context in which the phrase is used.

As used herein, comparative terms such as "increased," "decreased," "better," "worse," "higher," "lower," "enhanced," "maximized," and "minimized," and the like refer to a property of a device, component, or activity that is measurably different from other comparable devices, components, or activities, or from different iterations or embodiments of the same device, properties in the known state of the art. For example, a data region that has an "increased" risk of corruption can refer to a region of a memory device, which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment. Occurrences of the phrase "in one embodiment," or "in one aspect," herein do not necessarily all refer to the same embodiment or aspect.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Example Embodiments

An initial overview of technology embodiments is provided below and specific technology embodiments are then described in further detail. This initial summary is intended to aid readers in understanding the technology more quickly, but is not intended to identify key or essential features of the technology nor is it intended to limit the scope of the claimed subject matter.

One way of increasing the density of flash memory devices is to form stacked memory cell arrays, e.g., often referred to as three-dimensional (3D) memory arrays. For example, one type of three-dimensional memory array may include pillars of stacked memory elements, such as substantially vertical NAND strings. With a vertical NAND string, memory density can be further increased by increasing the number of vertically stacked memory elements in the pillars. This can be done by increasing the number of tiers or layers of material used to form the memory elements. With increased layers of material, however, comes increased difficulty in forming straight and uniform holes or openings through all of the layers to form the pillars. Thus, memory density can be increased by enabling the formation of suitable openings through increased layers of material.

One way to improve the ability to make straight holes through many layers of material is to select materials that have similar etching properties for a given type of etch or etch chemistry. In one aspect, alternating layers of materials with similar etching properties may be electrically conductive. Layers of one electrically conductive material can be removed to avoid electrically coupling the layers of the other material, which may form word lines. The removed layers of material can form voids between word lines that serve as electrical insulators between the word lines, which can improve performance and power efficiency. In one example, a flash memory component is provided that can include a plurality of conductive layers vertically spaced apart from one another and separated by voids, each of the plurality of conductive layers forming a word line. The memory component can also include a vertically oriented conductive channel extending through the plurality of conductive layers. In addition, the flash memory component can include a plurality of memory cells coupling the plurality of conductive layers to the conductive channel. Each word line can be associated with one of the plurality of memory cells. Associated devices, systems, and methods are also disclosed.

Referring to FIG. 1, a portion of a flash memory component 100 is illustrated. This figure shows a cross-section of the flash memory component with a vertically oriented cut plane to show various features and geometries of the flash memory component 100 in vertical cross-section. In general, the portion of the flash memory component includes a memory pillar or conductive channel 110 and memory cells 120a-n (i.e., a string 121 of memory cells, such as a NAND string) located adjacent to the conductive channel 110. Any suitable number of memory cells can be included. The conductive channel 110 can be made of any suitable material, such as a semiconductor material (e.g., polysilicon, germanium (e.g., Ge or SiGe), etc.), such that the conductive channel can act as a channel region for the memory cells 120a-n, which can be coupled in series. For example, during operation of one or more of the memory cells 120a-n of the string, an electrical channel can be formed in the conductive channel 110. In some embodiments, the conductive channel 110 can have a hollow interior that is at least partially, or substantially filled with an insulative material 115, such as an oxide material. The conductive channel 110 and the string of memory cells 120a-n can be oriented vertically, such as in a three-dimensional memory array. For example, memory cell 120a is located at a vertical level (e.g., near the top of the memory array) that is above a vertical level (e.g., near the bottom of the memory array) at which memory cell 120n is located. In some embodiments, the conductive channel 110 can have a generally cylindrical configuration and the structures of each memory cell 120a-n will be disposed in concentric ring-like structures radially outward from the conductive channel.

Each memory cell 120a-n of the string 121 can be coupled in series with and can be between a select gate (e.g., a drain select gate) 111 adjacent to (e.g., in contact with) the conductive channel 110 and a select gate (e.g., a source select gate) 112 adjacent to (e.g., in contact with) the conductive channel 110. The conductive channel 110 is electrically coupled to a data line (e.g., a bit line 116), indicated at 117. Thus, the select gate 111 can selectively couple the string 121 to the data line (e.g., the bit line 116). In addition, the conductive channel 110 is electrically coupled to a source line 118, indicated at 119. Thus, the select gate 112 can selectively couple the string 121 to the source line 118. For example, the select gate 111 can be coupled in series with memory cell 120a, and the select gate 112 can be coupled in series with memory cell 120n. The select gates 111 and 112 can each include a gate dielectric 113 adjacent to (e.g., in contact with) conductive channel 110 and a control gate 114 adjacent to (e.g., in contact with) a corresponding gate dielectric 113.

Each memory cell 120a-n in this example may be a non-volatile memory cell and may have a charge storage structure, such as a floating gate that may be a conductor (e.g., polysilicon), a charge trap that may be a dielectric, etc. Non-limiting examples of conductive or semi-conductive material that are suitable for a floating gate include polysilicon, silicated or non-silicated metal such as Ru, Pt, Ge, etc., with metals being either continuous or discontinuous. Non-limiting examples of dielectrics that are suitable for charge traps include nitrides, a silicon rich dielectric, or SiON/$Si_3N_4$. A tunnel dielectric for a charge trap-based device can be of multiple layers (e.g., oxide/nitride/oxide (O/N/O)) instead of a single dielectric layer, which is typical of floating gate tunnel dielectrics.

Figure 2:
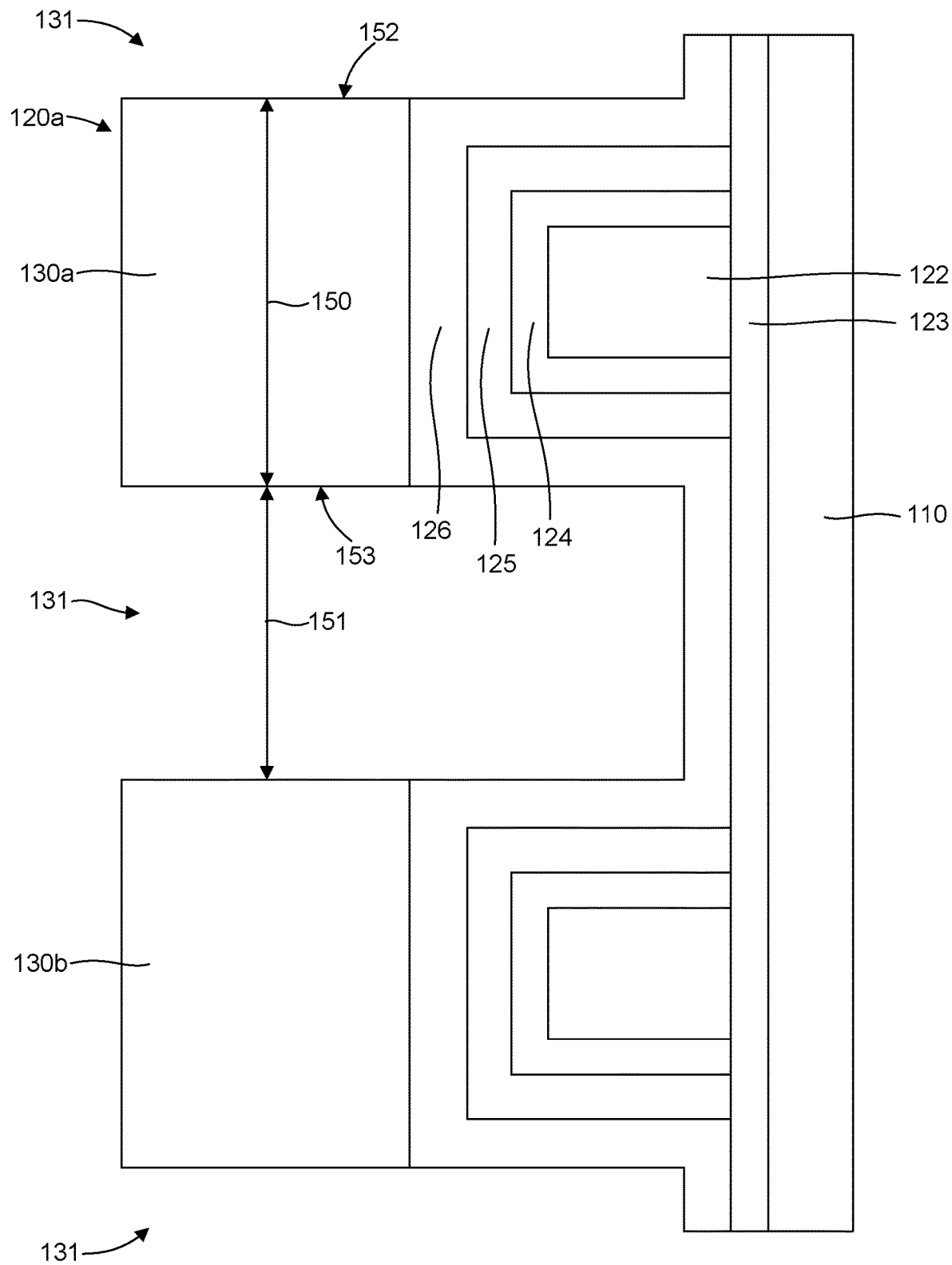
FIG. 2 illustrates a detailed view of a portion of a conductive channel and a memory cell of the flash memory component of FIG. 1.

FIG. 2 illustrates a detail view of a portion of the conductive channel 110 and portions of representative memory cells 120a, 120b (region identified at 127 in FIG. 1). As a schematic representation, FIG. 2 does not necessarily depict certain features as they would be found in an actual memory cell. For example, straight lines shown in the figure may not be exactly straight, and sharp corners may be rounded.

Each memory cell 120a-n can have a charge storage structure 122. The memory cells may be non-volatile memory cells (e.g. floating gate MOSFET, charge trap, etc.). The charge storage structures 122 can be floating gates that may be any suitable material (e.g., polysilicon, SiN, silicated metal, etc.) having any suitable property (e.g., electrical conductivity and charge capture/store/isolation). Each memory cell 120a-n can also have a tunnel dielectric layer 123 interposed between its charge storage structure 122 and the conductive channel 110. The tunnel dielectric layers between the charge storage structures and the conductive channels can comprise any suitable dielectric material. For example, the tunnel dielectric layer 123 can comprise an oxide material (e.g., silicon oxide), ONO (oxide/nitride/oxide), etc.

In addition, each memory cell 120a-n can have a control gate (e.g., as a portion of, or coupled to access lines, such as word lines) laterally separated from the charge storage structure. For example, the memory cells 120a, 120b can include respective control gates 130a, 130b. The control gate 130a can be laterally separated from the charge storage structure 122 such that the charge storage structure 122 is between the control gate 130a and the conductive channel 110. The control gates 130a, 130b can comprise any suitable conductive or semi-conductive material. For example, the control gates 130a, 130b can comprise polysilicon (e.g., doped, or undoped) or other suitable material in accordance with the principles disclosed herein.

Each memory cell 120a-n can have one or more dielectric materials or dielectric layers interposed between its charge storage structure and the control gate, which may serve as blocking dielectrics. For example, the memory cell 120a can include dielectric layers 124-126 interposed between the charge storage structure 122 and the control gate 130a. The dielectric layers between the charge storage structures and the control gates can comprise any suitable dielectric material and two or more of the dielectric layers may have the same or different material composition. For example, dielectric layer 124 can comprise an oxide material (e.g., silicon oxide), an oxynitride material (e.g., silicon oxynitride), a high dielectric constant material (e.g., HfSiOx, HfOx, AlOx, and ZrOx), etc. Dielectric layer 125 can comprise a nitride material (e.g., silicon nitride), an oxide material (e.g., silicon oxide), etc. Dielectric layer 126 can comprise an oxide material (e.g., silicon oxide), an oxynitride material (e.g., silicon oxynitride), a high dielectric constant material (e.g., HfSiOx, HfOx, AlOx, and ZrOx), etc.

The control gates of the memory cells 120a-n can be part of conductive layers that form word lines. Each word line is associated with one of the memory cells. The conductive layers are vertically spaced apart from one another and separated by voids or gaps 131. As illustrated in FIG. 2, the conductive layers can have a thickness 150 of from about 10 nm to about 40 nm. The conductive layers can be vertically spaced apart from one another by a distance 151 of from about 5 nm to about 50 nm. The voids 131 can be filled with a gas, such as air, argon, nitrogen, etc. The conductive channel 110 can extend vertically along or through the conductive layers. The memory cells 120a-n can mechanically couple the conductive layers (i.e., the control gates) to the conductive channel 110 and therefore provide support for the conductive layers, which are separated by the voids 131. As described in more detail below, the voids 131 can be formed by removing temporary spacers or layers of material from between the conductive layers. In some cases, the conductive layers can therefore have some residue of the temporary spacers or layers of material present on outer surfaces of the conductive layers. In one embodiment, the temporary spacers or layers of material can comprise or be made of SiGe. Thus, one or more of the conductive layers 130a, 130b can have a SiGe residue on a top surface and/or a bottom surface, as indicated at 152, 153 in FIG. 2.

Figure 3:
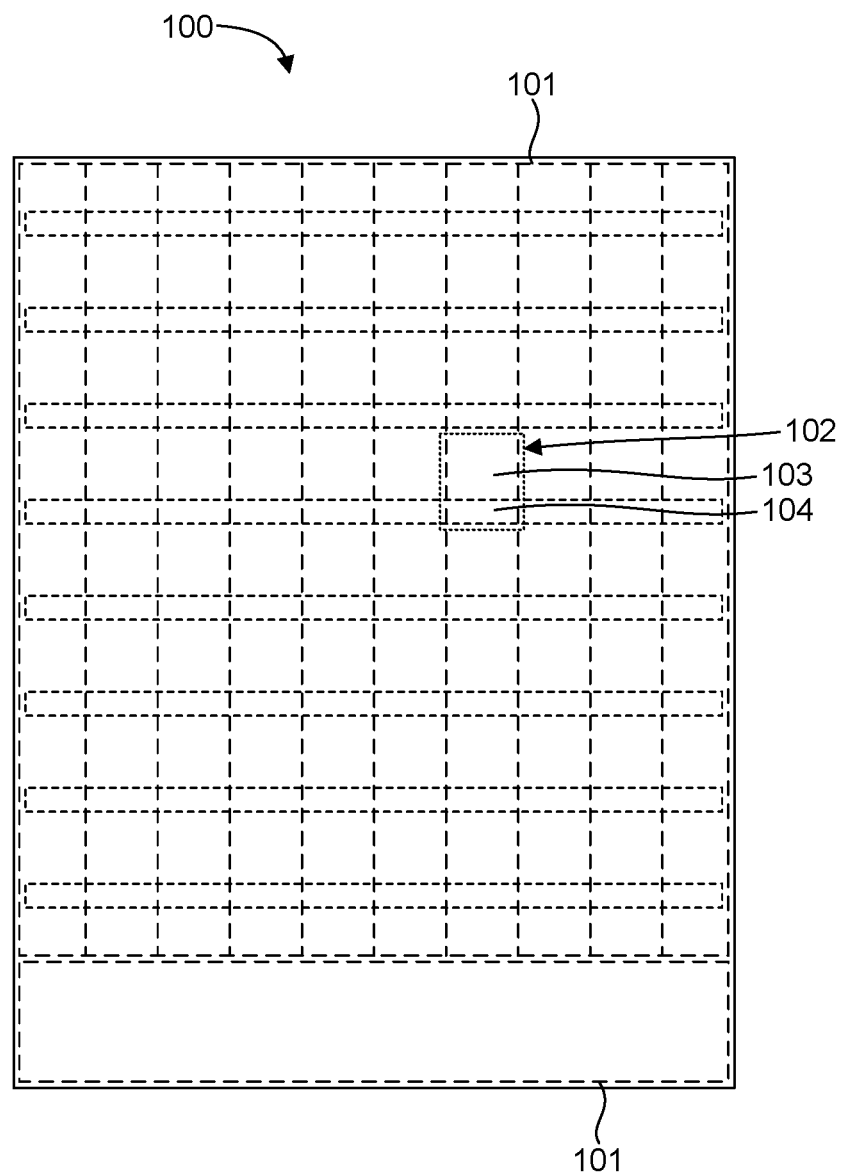
FIG. 3 illustrates a general layout of a flash memory component in accordance with an example embodiment.

An example of a general layout or arrangement of a flash memory component 100 is illustrated in FIG. 3. This plan view shows a memory array region (i.e., a general or global memory array region indicated generally at 101) and a periphery (i.e., a global periphery portion or region indicated generally at 102). The general memory array region 101 is subdivided or segmented into blocks of memory arrays, with each block having a local or block memory array and a staircase. A staircase facilitates electrical connections to word lines connected to memory cells in a local or block memory array. For example, a typical memory block 102 includes a local or block memory array portion or region 103 and a staircase portion or region 104.

Figure 4:
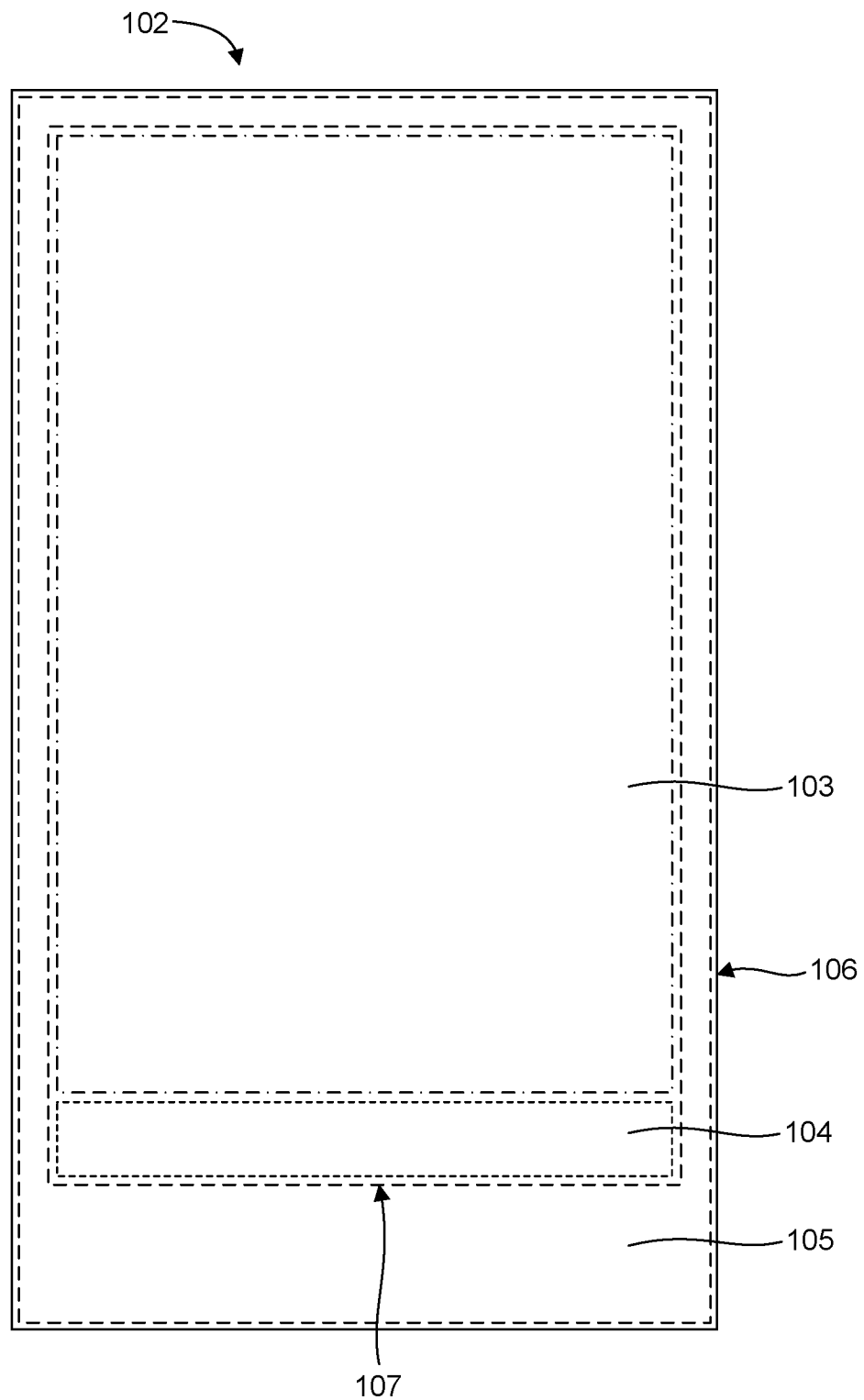
FIG. 4 illustrates a general layout of a memory block of the flash memory component of FIG. 3.

The general layout or arrangement of the memory block 102 is shown in FIG. 4. This figure shows the memory array portion 103 and the staircase portion 104 in more detail. In addition, FIG. 4 shows a local or block periphery portion 105 about the memory array portion 103 and the staircase portion 104. The local or block periphery portion 105 between memory blocks may provide room for CMOS connections and routing. Walls can be formed, such as at 106, 107, to separate memory blocks from one another and/or to separate a periphery portion from a memory array portion and/or a staircase region.

FIGS. 5A-5G illustrate aspects of exemplary methods or processes for making a flash memory component as disclosed herein, such as the flash memory component 100. In particular, these figures demonstrate how to form structures in or associated with a memory array region of a flash memory component as disclosed herein.

Figure 5A:
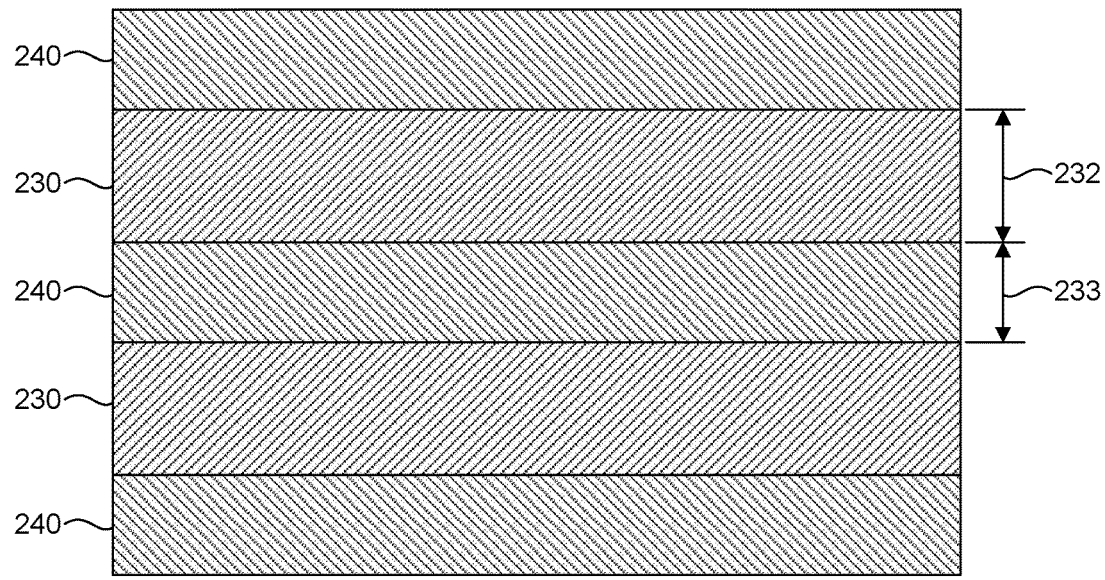
FIGS. 5A-5G illustrate methods for making a flash memory component in accordance with an example embodiment.

FIG. 5A illustrates a side cross-sectional view of alternating layers 230, 240 of materials. The layers 230 are vertically spaced apart from one another by the layers 240, which are interposed between the layers 230. For context, the layers 230 will form word lines or control gates and the layers 240 serve as temporary spacers and will later be removed to form voids between the layers 320. The alternating layers can be formed by any suitable technique or process, such as a deposition process. The thicknesses of the layers can correspond at least generally to desired final dimensions of the word lines or control gates, such as thickness and vertical spacing between word lines or control gates. For example, the layers 230 can have a thickness 232 of from about 10 nm to about 40 nm, and the layers 240 can have a thickness 233 of from about 5 nm to about 50 nm.

In one aspect, the materials of the layers 230, 240 can have similar etching properties. For example, the etching properties of the layer 230, 240 materials can enable etching of holes in the materials having aspect ratios greater than or equal to 100. This can facilitate construction of flash memory components with increased numbers of vertically arranged memory cells in a 3D NAND device over those constructed with dissimilar etching properties due to the ability to form vertical openings through the layers that meet tolerances for memory pillar construction. Any suitable material or combination of materials can be utilized for the layers 230, 240. In some embodiments, the material of the layers 230 that will form word lines or control gates can be polysilicon (e.g., conductively doped polysilicon, such as n-type polysilicon), and the material of the layers 240 that may serve as a temporary spacer can be SiGe (e.g., 30-50% Ge). These materials have been found to have suitable and similar etching properties or chemistries, which can enable etching openings with straight profiles in the heterostructure shown in FIG. 5A. Because the layers 240 may be removed prior to formation of the final product, both materials of the layers 230, 240 can be electrically conductive or semiconductive. For example, the materials of the layers 230, 240 can have an electrical resistivity less than or equal to $2 \times 10^{-3} \Omega \cdot m$. In one aspect, a material can be selected for the layers 230 which in the final dimensional configuration will result in a word line resistance of less than or equal to 300 kΩ.

Figure 5B:
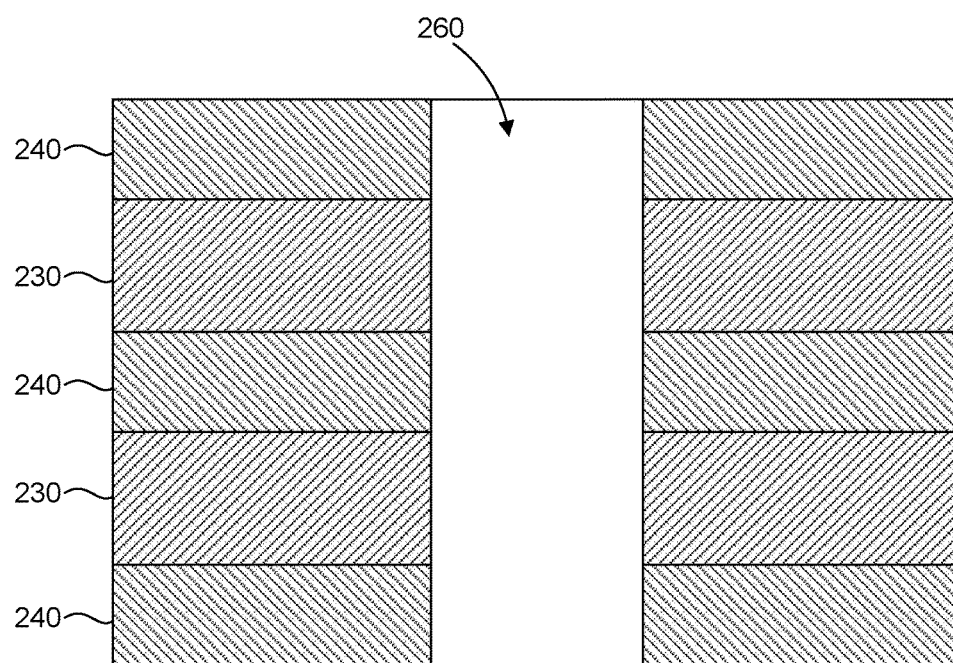

FIG. 5B shows a vertically oriented opening 260 extending through the layers 230, 240. The opening 260 can be formed by any suitable method, such as by an etching process. The etching process can utilize a chemistry tuned for uniform etch profiles of the materials in layers 230, 240, such that the different layer materials etch equally or almost/substantially equally (i.e., sufficient to produce the opening 260 within suitable dimensional and/or form tolerances). In some embodiments, such as when the materials in the layers 230, 240 comprise polysilicon and SiGe, a flourocarbon plasma etching process can be utilized. For example, the flourocarbon plasma etching process can comprise a $C_4F_8$/Ar/$N_2$ gas mixture. Flourocarbon plasma etching can provide straight or vertical sidewalls of a heterostructure comprising layers of Si and SiGe material. By using fluorocarbon etch gases with high carbon content, fluorocarbon sidewall passivation improves the anisotropy of etched feature profiles by preventing lateral etching of SiGe. Etch results with a $C_4F_8$/Ar/$N_2$ gas mixture have shown a straight sidewall profile through layers of Si and SiGe.

Figure 5C:
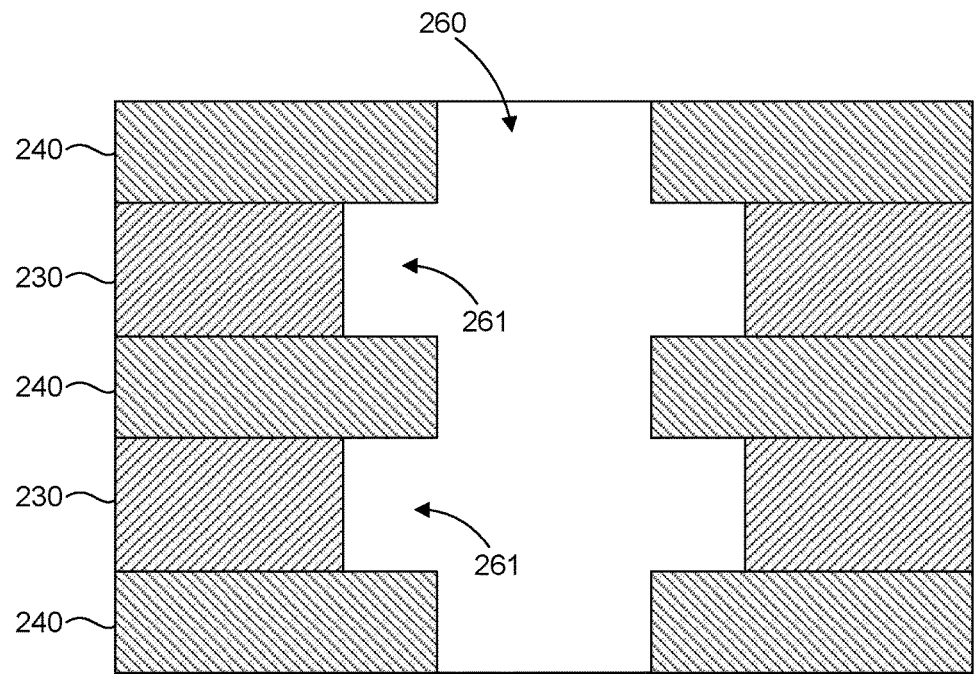

With the opening 260 formed in the layers 230, 240, memory cells associated the layers 230 can be formed. As shown in FIG. 5C, recesses 261 (e.g., control gate recesses) can be formed from the vertically oriented opening 260 into the layers 230, such that the recesses 261 are defined by the materials of the layers 230, 240. The recesses 261 can be formed by any suitable method, such as by an etching process (e.g., a wet etching process). The etching process can utilize a chemistry tuned to selectively etch the material of layer 230 over the material of layer 240. In some embodiments, such as when the materials in the layers 230, 240 comprise polysilicon and SiGe, a wet etching process comprising tetramethylammonium hydroxide (TMAH) can be utilized to selectively etch polysilicon that may form word lines or control gates over SiGe serving as a temporary spacer material due to the higher etch rate of silicon with this chemistry (selectivity >100) compared to SiGe.

Figure 5D:
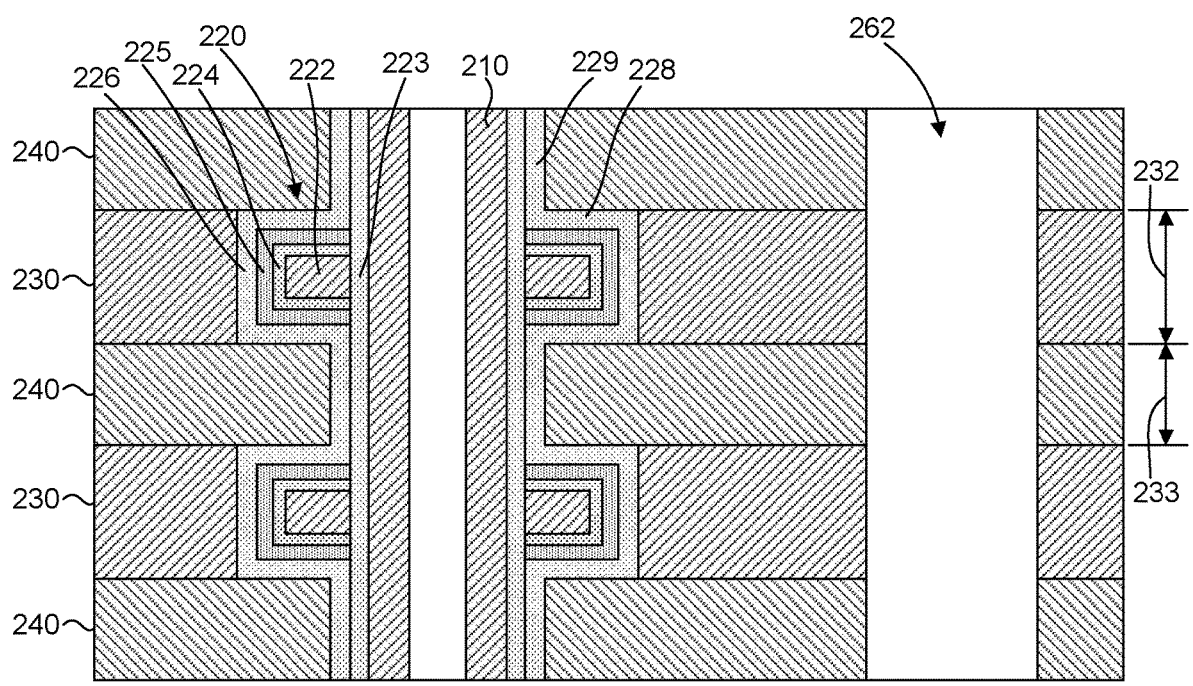

Utilizing the opening 260, memory cells 220 can be formed in the recesses 261 by any suitable process or technique known in the art, as shown in FIG. 5D. For example, dielectric or blocking layers 224-226, a charge storage structure 222, (e.g., a floating gate), and a tunnel dielectric 223 can be formed by oxidation and/or deposition processes as known in the art for forming memory cell structures, such as those described herein. A conductive channel 210 extending through the layers 230, 240 can be formed in the vertically oriented opening 260. The conductive channel 210 can be coupled (e.g. mechanically coupled) to the layers 230 by the memory cells 220 (e.g. indirectly coupled). The conductive channel 210 can comprise any suitable material, such as polysilicon, Ge, SiGe, etc. The conductive channel 210 can be formed by any suitable technique or process, such as a deposition process. Although the conductive channel 210 is illustrated as being hollow, in some embodiments, the conductive channel 210 can be filled with a suitable insulative material, such as silicon oxide.

FIG. 5D also shows a vertically oriented slot 261 extending through the layers 230, 240. The slot 261 can be configured to form a barrier or wall dividing or separating regions of a flash memory component from one another, such as separating memory blocks from one another, etc. as shown in FIGS. 3 and 4 and described above. The slot 261 can also serve to provide access to the layers 240 so that the layers can be removed to form voids between the layers 230, as discussed in more detail below. The slot 261 can be formed by any suitable method, such as by an etching process. The etching process can utilize a chemistry tuned for uniform etch profiles of the materials in layers 230, 240, such that the different layer materials etch equally or almost equally (i.e., sufficient to produce the slot 261 within suitable dimensional and/or form tolerances). In some embodiments, such as when the materials in the layers 230, 240 comprise polysilicon and SiGe, a flourocarbon plasma etching process can be utilized. For example, the flourocarbon plasma etching process can comprise a $C_4F_8/Ar/N_2$ gas mixture. The process to form the slot 261 can therefore be similar to that utilized to form the opening 260.

Figure 5E:
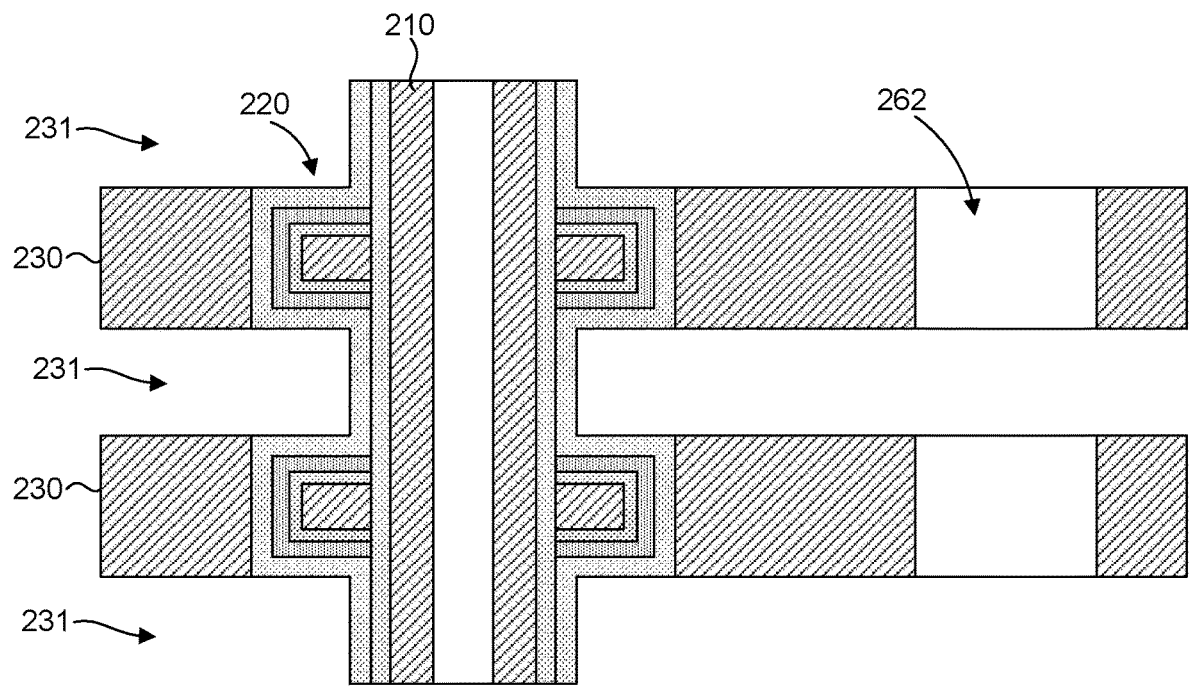

Once the memory cells 220 and conductive channel 210 have been formed, the layers 240 can be removed, as shown in FIG. 5E. The layers 240 can be selectively removed by any suitable technique or process, such as an etching process. In this case, an etchant can access the layers 240 through the vertically oriented slot 262 and can laterally and selectively etch away the layers 240 leaving gaps or voids 231 between the layers 230. Any suitable etching process can be utilized, such as a dry etching process. In some embodiments, the etching process can comprise a $ClF_3$ dry etching process. In some embodiments, such as when the materials in the layers 230, 240 comprise polysilicon and SiGe, a $ClF_3$ dry etching process can be utilized to selectively etch the SiGe temporary spacer material over polysilicon forming the word lines or control gates due to the higher etch rate of SiGe with this chemistry (selectivity >1000) compared to silicon. In addition, other materials (e.g., $SiO_2$, SiN, metals, etc.) may not be affected by the reaction of the $ClF_3$ gas.

Thus, after the memory cells 220 and conductive channel 210 (i.e., memory pillars) have been formed, the layers 240 serving as temporary supports can be removed to electrically isolate the layers 230 from one another. The voids 231 between the layers 230 can be filled with a gas (e.g., air, nitrogen, etc.) to provide electrical insulation without the presence of a solid electrically insulative material between word lines as is typically the case. This type of structure can provide the benefit of reduced capacitance between word lines, resulting in better performance and power efficiency of the memory array. In addition, the conductive channel 210, which is mechanically coupled to the layers 230 via the memory cells 220, can serve as a structural support for the layers 230 to maintain the integrity of the structure.

In one aspect, some or all of the structures and features shown in FIGS. 5D and 5E can be part of or represent a precursor to a flash memory component as disclosed herein.

Figure 5F:
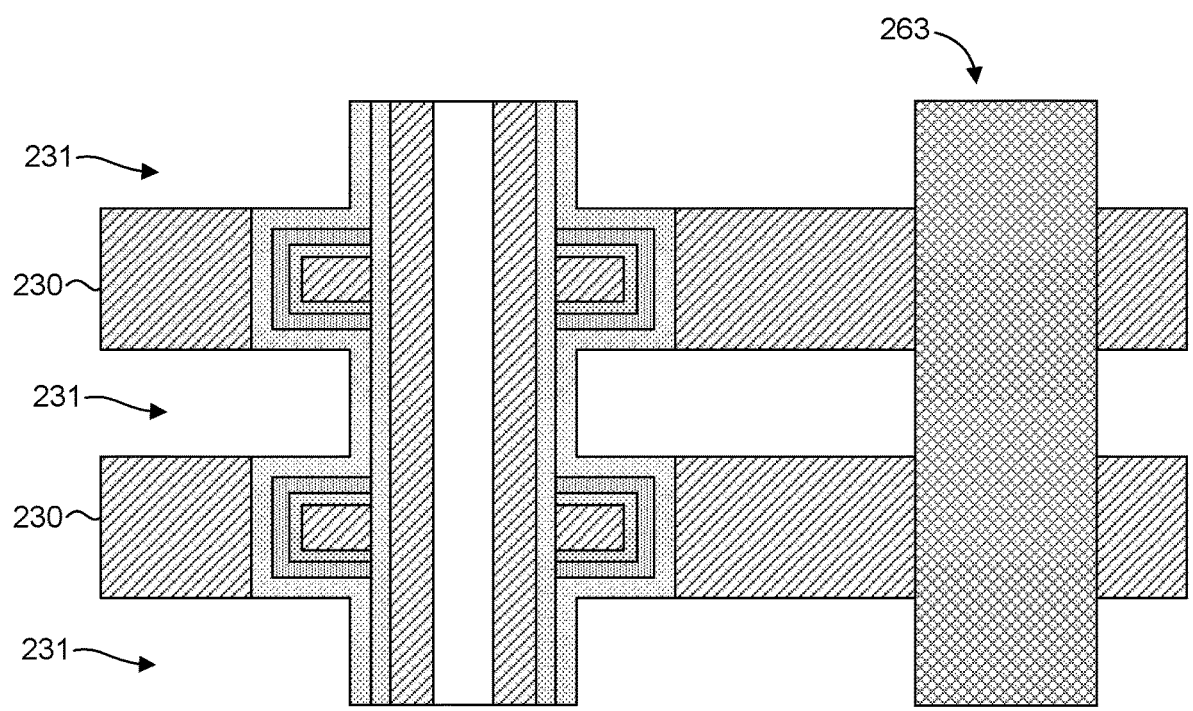

FIG. 5F shows a wall 263 disposed or formed in the slot 262. The wall 263 can serve to divide or separate regions of a flash memory component from one another, such as separating memory blocks from one another. The wall 263 can extend through, and be mechanically coupled with, the layers 230. This can enable the wall 263 to provide structural support for the layers 230 to maintain the structural integrity of the structure with the presence of the voids 231 between the layers 230. The wall 263 can comprise any suitable wall material, such as a conductive or semi-conductive material (e.g., polysilicon material) and/or an insulative material (e.g., a dielectric such as an oxide material). The wall 263 can be formed by any suitable process or technique, such as a deposition process (e.g., a spin on dielectric (SOD) material).

In one aspect, the structures and features shown in FIG. 5F can be part of a flash memory component as disclosed herein in its final configuration.

Referring again to FIG. 5D, when the dielectric layer 226 is formed by oxidizing the materials of the layers 230, 240 (e.g., growing an oxide layer), the composition of the oxide material will depend on the type of material oxidized. An oxidation process may result in a layer of oxide material at 228, 229 formed from the material of the layers 240 that is not a suitable insulator material and/or contains electron trapping centers, which can be detrimental to performance. For example, oxidizing SiGe can form a layer of SiGe-oxide, which may be undesirable for the performance of the memory cells 220.

Figure 5G:
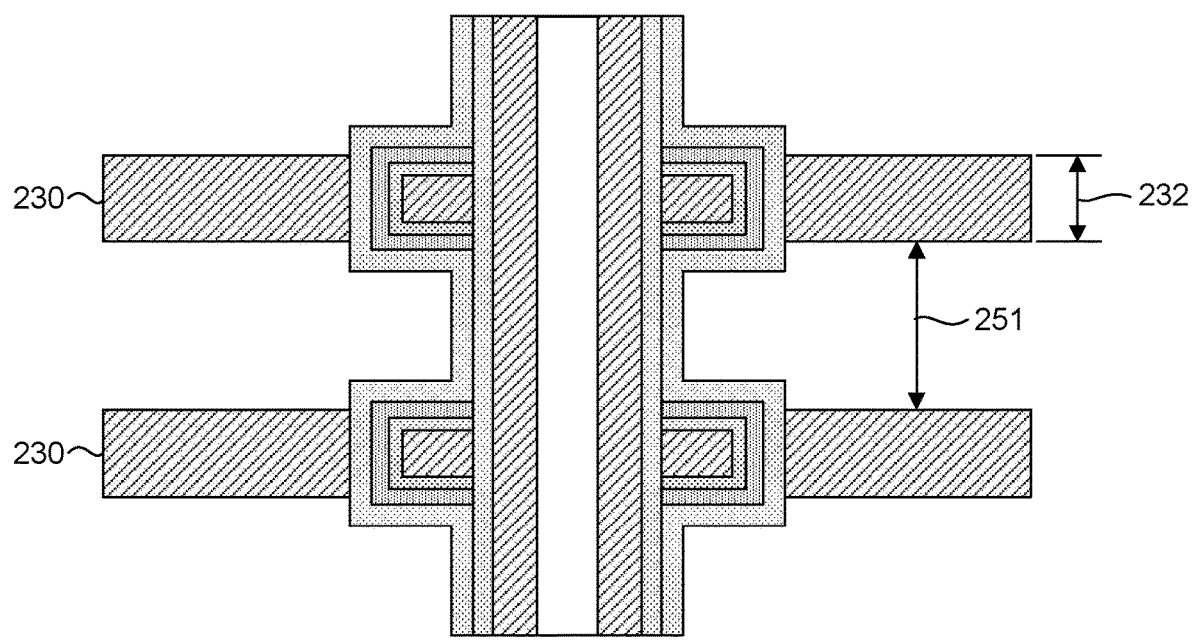

As an alternative, in order to avoid the presence of an undesirable material, the dielectric layer 226 can be formed by depositing dielectric material in the recesses 261 on the layers 230, 240. In this case, because the deposition process adds material as opposed to consuming some material (as in an oxidation process), the thicknesses 232, 233 of the respective layers 230, 240 may need to be adjusted accordingly to arrive at suitable final dimensions for the word line and/or memory cell components. For example, the layers 230 may be made thicker and the layers 240 may be made thinner than in the case where the dielectric layer 226 is formed by oxidation. In some embodiments, the layers 230 can have an initial thickness 232 of from about 10 nm to about 40 nm. After removal of the layers 240 to form the voids 231, the thickness 232 of the layers 230 can be reduced, as shown in FIG. 5G. In some embodiments, the thickness of the layers 230 can be reduced to a final dimension of about 5 nm to about 35 nm. The thickness of the layers 230 can be reduced by any suitable technique or process, such as an etching process. Reducing the thickness of the layers 230 can be done to increase space or distance 251 between word lines in order to reduce capacitance, to clean up residue on the layers 230 left over from the removal of the layers 240, etc.

In one aspect, the structures and features shown in FIG. 5G can be part of a flash memory component as disclosed herein in its final configuration.

FIGS. 6A-6G illustrate aspects of other exemplary methods or processes for making a flash memory component, such as the flash memory component 100. In particular, these figures demonstrate how to form various structures in a staircase region of a flash memory component as disclosed herein.

Figure 6A:
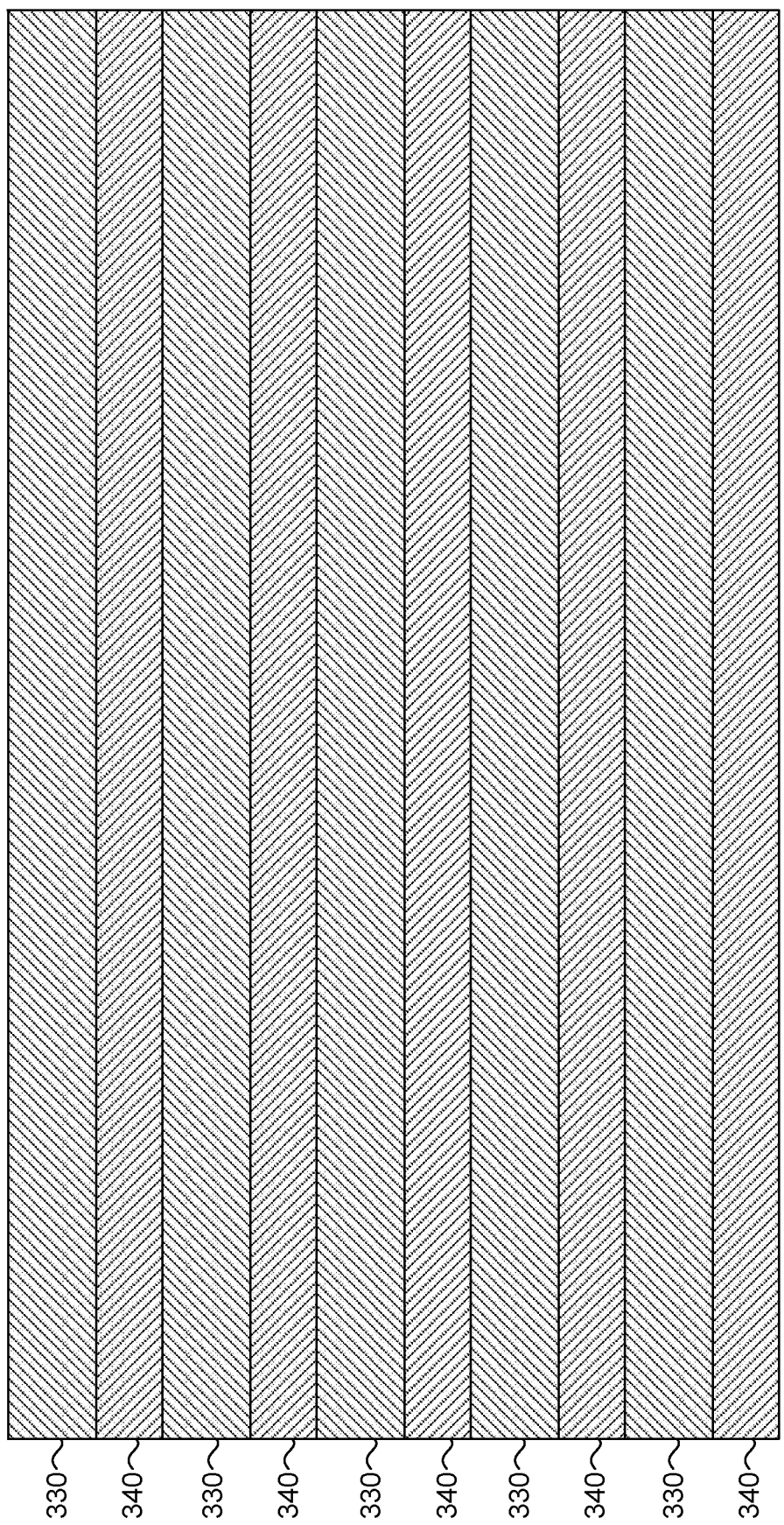
Figure 6B:
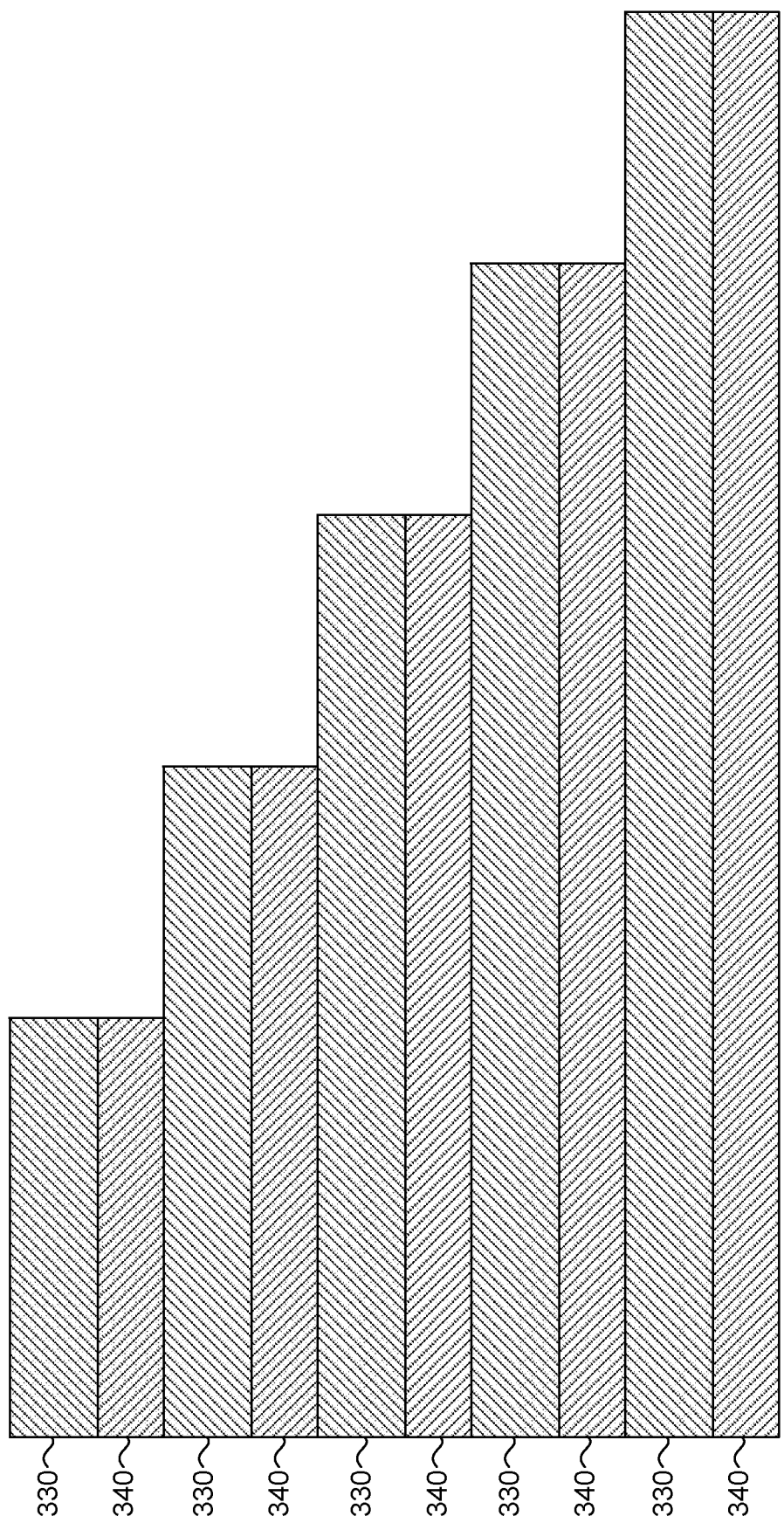

As shown in FIG. 6A, the process can begin similar to that described above with reference to FIG. 5A, where alternating layers 330, 340 of materials are formed. FIG. 6B illustrates the formation of the layers 330, 340 into a series of steps in a staircase region of a flash memory component to facilitate electrically coupling with word lines formed by the layers 330. The layers 330, 340 can be formed into a series of steps by any suitable technique or process, such as an etching process. In some embodiments, the etching process can comprise a reactive-ion etching (RIE) etching process. In some embodiments, such as when the materials in the layers 330, 340 comprise polysilicon and SiGe, the RIE etch can selectively etch the polysilicon over the SiGe. A filler material 364 (e.g., an oxide material such as $SiO_2$) can then be deposited over the staircase formation, as shown in FIG. 6C, by any suitable technique known in the art.

Figure 6D:
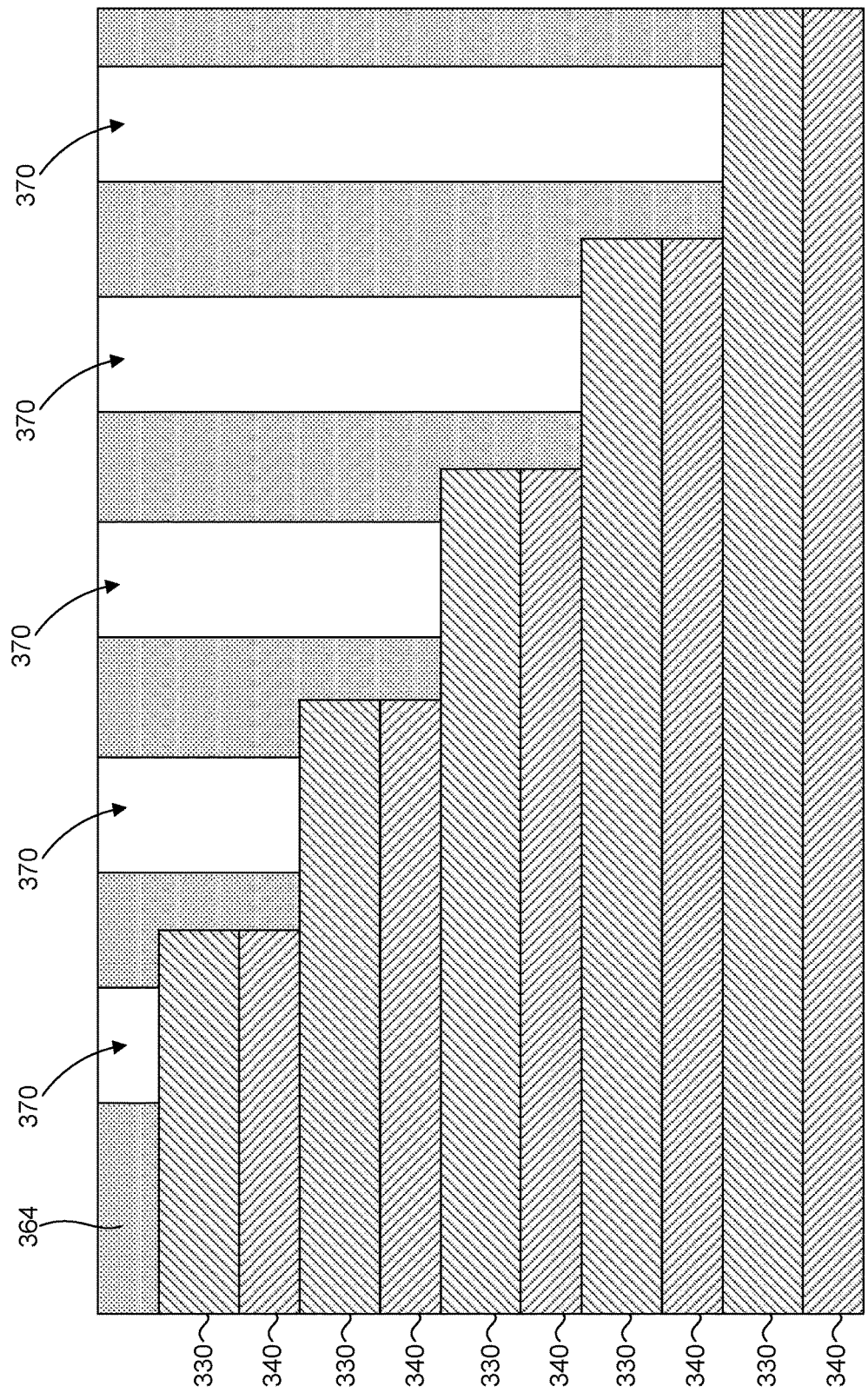
Figure 6E:
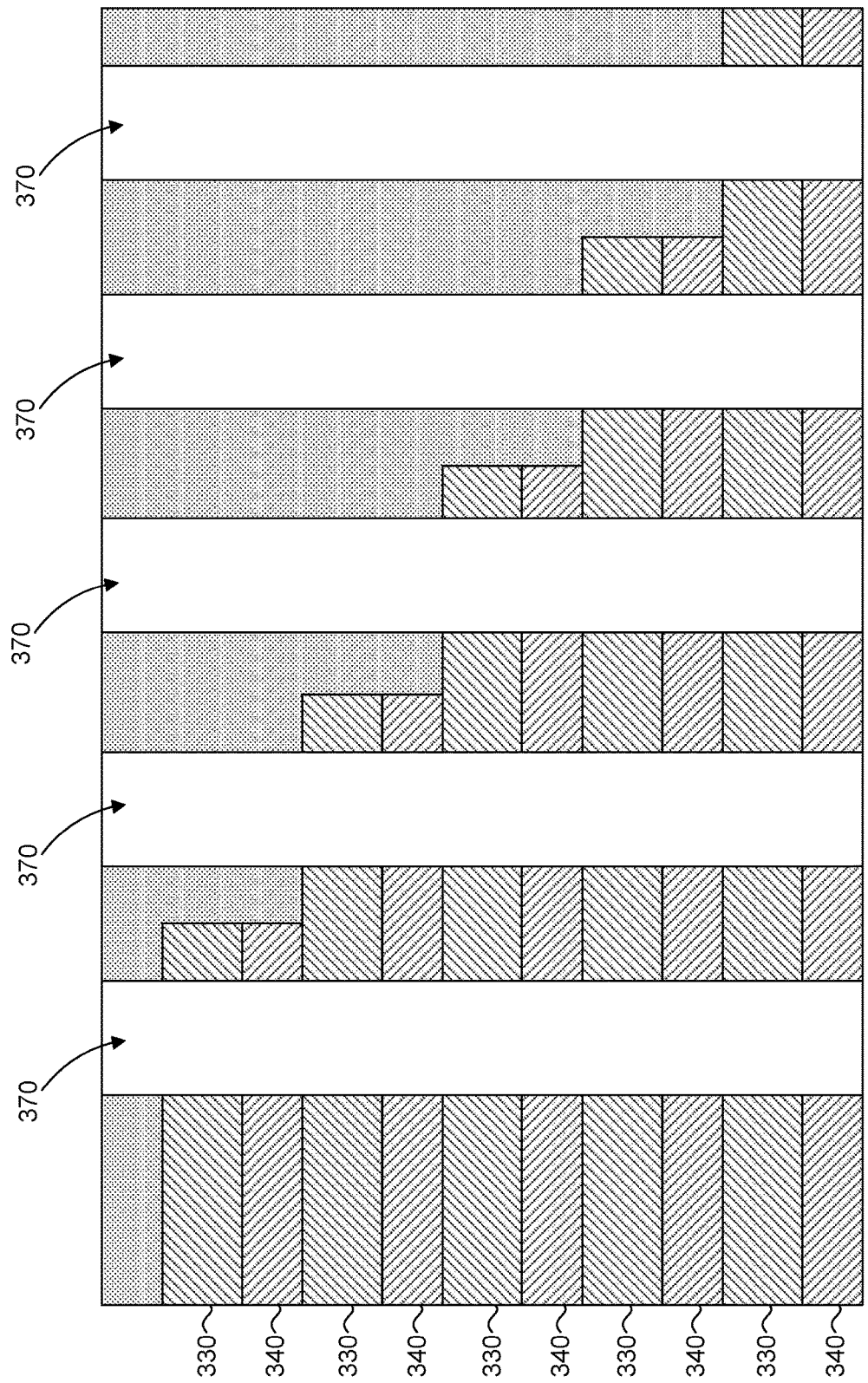

Vertically oriented support columns can then be formed to provide support for the layers 330 once the layers 340 have been removed. To form such support columns, support column openings can be formed through the filler material 364 and the layers 330, 340. In one aspect, support column openings 370 can be initially formed through the filler material 364 overlying the staircase formation of the layers 330, 340, as shown in FIG. 6D. The support column openings 370 can be formed by any suitable process or technique, such as an etching process. At this point, the support column openings 370 can terminate on the layers 330 that form the steps in the staircase region. The support column openings 370 can then be continued to extend through the layers 330, 340, as shown in FIG. 6E, to a desired location, such as a source line (not shown) underlying the layers 330, 340. The support column openings 370 can be formed through the layers 330, 340 utilizing any suitable technique or process, such as an etching process. In one aspect, an etching process can utilize a chemistry tuned for uniform etch profiles of the materials in layers 330, 340, such that the different layer materials etch equally or almost equally (i.e., sufficient to produce the opening 260 within suitable dimensional and/or form tolerances). In some embodiments, such as when the materials in the layers 330, 340 comprise polysilicon and SiGe, a flourocarbon plasma etching process can be utilized. For example, the flourocarbon plasma etching process can comprise a $C_4F_8/Ar/N_2$ gas mixture.

Figure 6F:
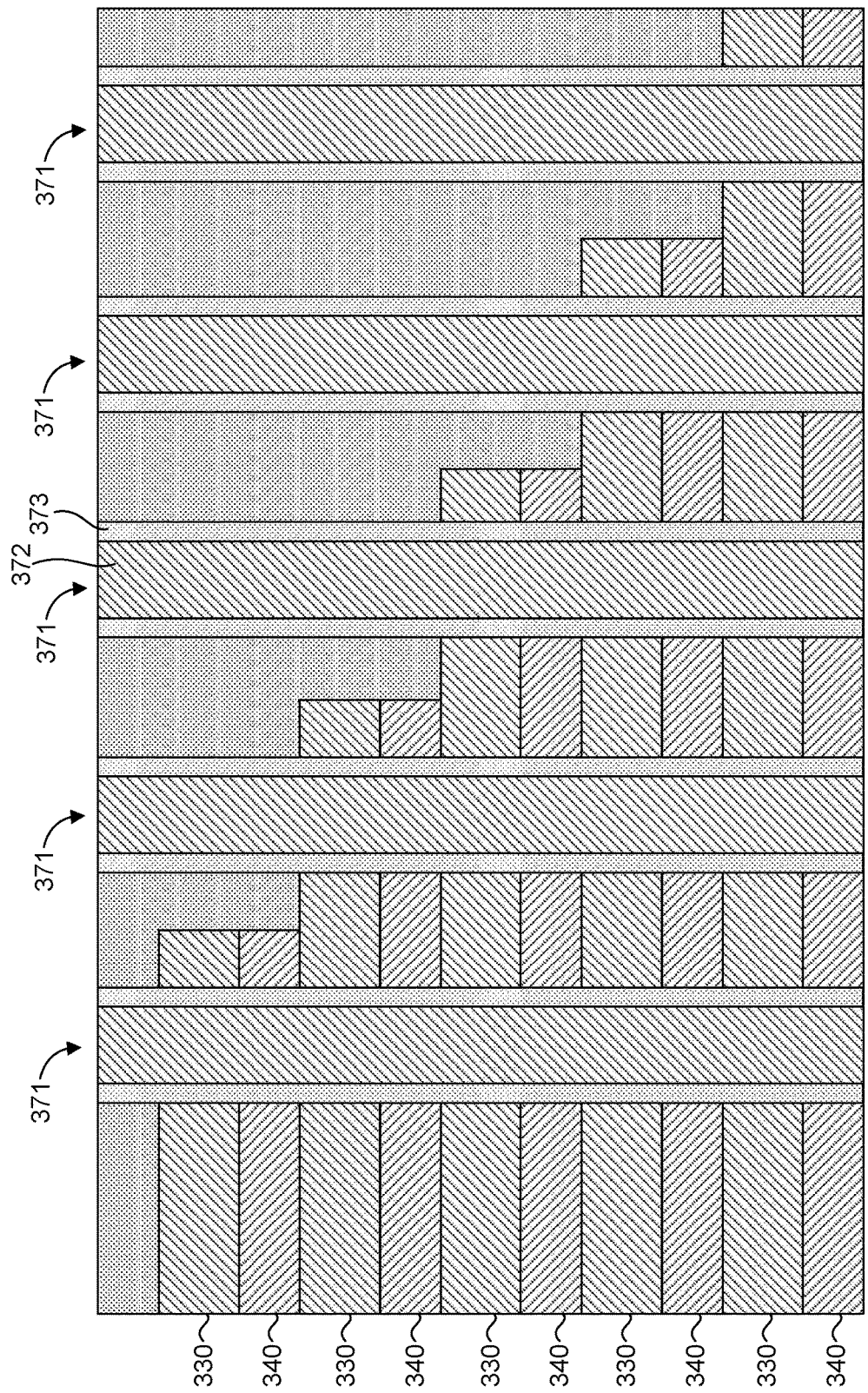

As shown in FIG. 6F, vertically oriented support columns 371 can be formed in the vertically oriented support column openings 370, such as be disposing a support column material in the openings 370. At this point, the support columns 371 can be coupled with (e.g. mechanically coupled with), at least one of the layers 330 and at least one of the layers 340 in the staircase region. The support columns 371 can have any suitable configuration or construction. In some embodiments, the support columns 371 can include a conductive material 372 surrounded by a non-conductive (e.g., a dielectric material) to provide structural support for the layers 330 once the layers 340 have been removed without electrically coupling the layers 330 to one another.

In a particular embodiment, the support columns 371 can be configured as memory pillars that are non-functional or dummy memory pillars. A non-functional or "dummy" memory pillar is electrically isolated from a data line or bit line and/or electrically isolated from a source line. In other words, a non-functional memory pillar is not electrically coupled to a data line or bit line and/or is not electrically coupled to a source line. Thus, in some embodiments, a non-functional memory pillar can have some or all of the characteristics of a functional memory pillar described above as found in the memory array (e.g., same construction, same materials, and proximity to memory cells), but differs in the lack of an electrical connection to a data or bit line and/or the lack of an electrical connection to a source line. Non-functional pillars can be of any suitable size. In one aspect, non-functional pillars can be sized different that functional pillars. In another aspect, non-functional pillars can be sized the same, or about the same as that of functional pillars. Non-functional memory pillars serving as the support columns can be constructed at the same time and utilizing the same processes as functional memory pillars made in a memory array. Non-functional memory pillars can be mechanically coupled to the layers 330, 340 via non-functional memory cells adjacent to the non-functional memory pillars.

Although not shown, contacts for electrically connecting with the word lines in the staircase region can be formed at any suitable point in the process once the staircase features have been formed in the layers 330.

In one aspect, some or all of the structures and features shown in FIGS. 6E and 6F can be part of or represent a precursor to a flash memory component as disclosed herein.

Figure 6G:
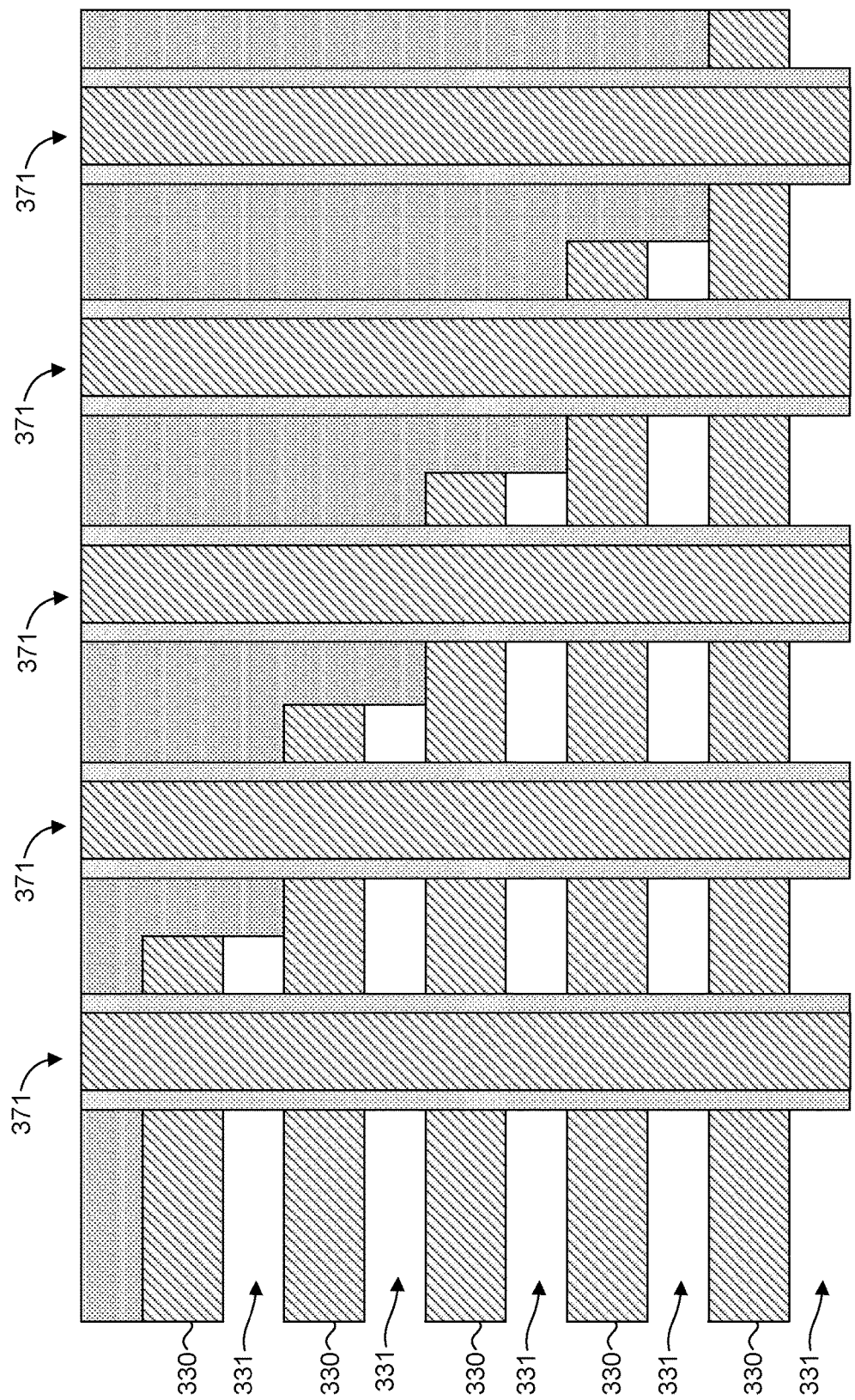

Once the support columns 371 have been formed, the layers 340 can be removed, as shown in FIG. 6G. The layers 340 can be selectively removed by any suitable technique or process, such as an etching process. In this case, an etchant can access the layers 340 through a vertically oriented slot (not shown), such as a slot used to form a barrier or wall for isolating or separating memory blocks from one another. The etchant can laterally and selectively etch away the layers 340 leaving gaps or voids 331 between the layers 330. Any suitable etching process can be utilized, such as a dry etching process. In some embodiments, the etching process can comprise a $CIF_3$ dry etching process. In some embodiments, such as when the materials in the layers 330, 340 comprise polysilicon and SiGe, a $CIF_3$ dry etching process can be utilized to selectively etch the SiGe temporary spacer material over polysilicon forming the word lines or control gates due to the higher etch rate of SiGe with this chemistry (selectivity >1000) compared to silicon. In addition, other materials (e.g., $SiO_2$, SiN, metals, etc.) may not be affected by the reaction of the $CIF_3$ gas.

In one aspect, the structures and features shown in FIG. 6G can be part of a flash memory component as disclosed herein in its final configuration.

The processes described herein for making flash memory components provides the ability to execute a pillar opening etch through more layers of material than is currently possible with a polysilicon/silicon oxide layer structure while maintaining acceptable dimension and/or form tolerances. Because in some embodiments the layers are formed with two conductive materials, the removal of one material to avoid electrically coupling word lines forms voids, which can provide a vacuum or gas (e.g., air) insulating medium between word lines, reducing capacitance and therefore improving performance.

Although the present disclosure is provided in the context of a NAND flash memory device (e.g., 3D NAND flash memory), it should be recognized that certain aspects of the present disclosure may also be applicable to NOR flash memory, charge trap flash memory (e.g., VNAND) or other memory utilizing floating gate metal-oxide-semiconductor field-effect transistors (FGMOSFET) as memory cells.

Figure 7:
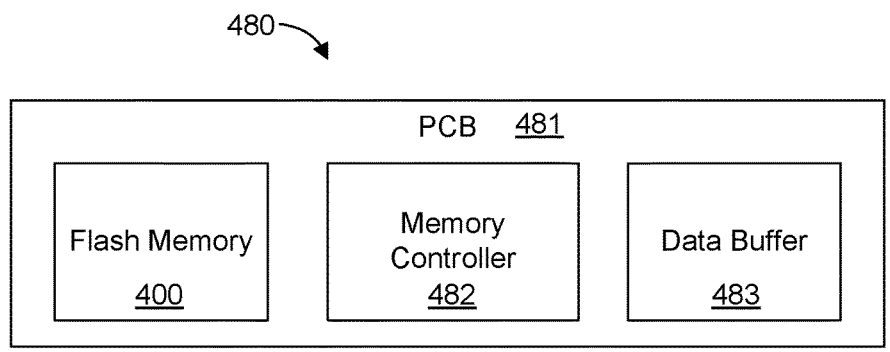
FIG. 7 is a schematic illustration of an exemplary solid state device.

Referring to FIG. 7, a schematic block diagram of an exemplary solid-state device 480 is illustrated. The solid-state device 480 can be, for example, a non-volatile memory device, such as a solid state memory device (e.g., a memory device such as a three-dimensional NAND memory device). The solid-state device 480 can include a printed circuit board (PCB) 481 and a flash memory component 400 as disclosed herein operably coupled to the PCB 481. The solid-state device 480 can also include a memory controller 482 operably coupled to the PCB 481. In addition, the solid-state device 480 can include a data buffer 483 operably coupled to the PCB 481.

Figure 8:
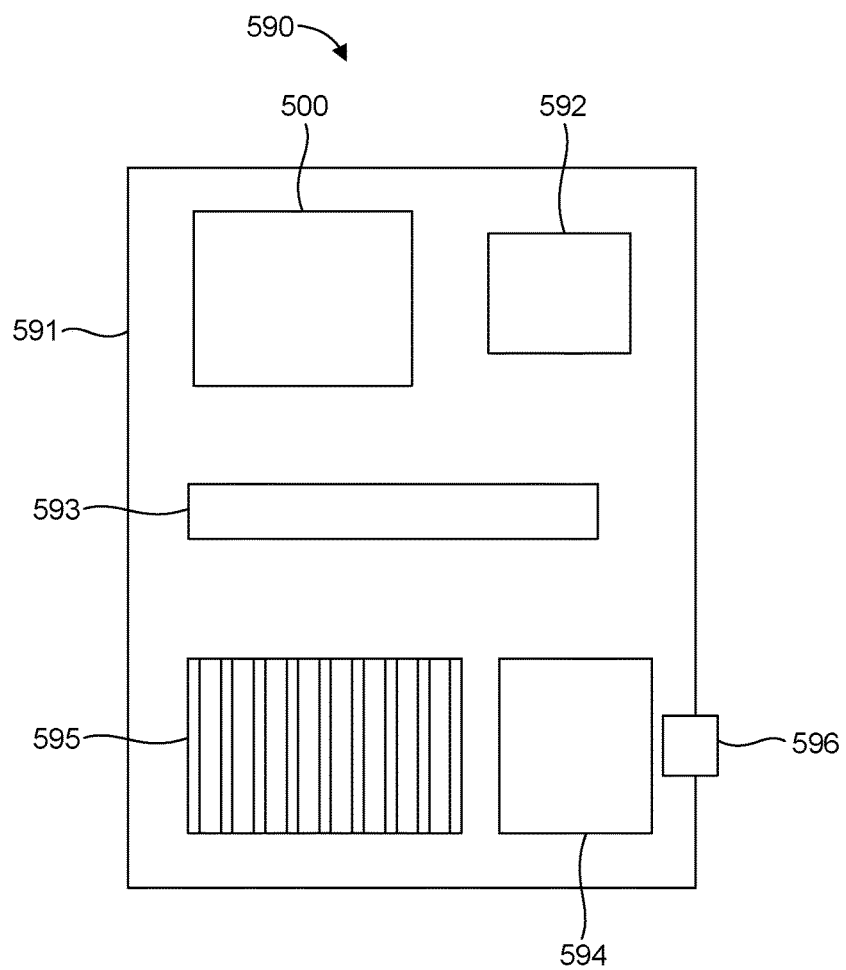
FIG. 8 is a schematic illustration of an exemplary computing system.

FIG. 8 illustrates an example computing system 590. The computing system 590 can include a flash memory component 500 as disclosed herein, coupled to a motherboard 591. In one aspect, the computing system 590 can also include a processor 592, a memory device 593, a radio 594, a heat sink 595, a port 596, a slot, or any other suitable device or component, which can be operably coupled to the motherboard 591. The computing system 590 can comprise any type of computing system, such as a desktop computer, a laptop computer, a tablet computer, a smartphone, a wearable device, a server, etc. Other embodiments need not include all of the features specified in FIG. 8, and may include alternative features not specified in FIG. 8.

Circuitry used in electronic components or devices (e.g., a die) of a memory device can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements, including such as those described herein), at least one input device, and at least one output device. Volatile and non-volatile memory and/or storage elements may be a RAM, EPROM, flash drive, optical drive, magnetic hard drive, solid state drive, or other medium for storing electronic data, including the memory disclosed herein. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

EXAMPLES

The following examples pertain to further embodiments.

In one example, there is provided a flash memory component comprising a plurality of conductive layers vertically spaced apart from one another and separated by voids, each of the plurality of conductive layers forming a word line, a vertically oriented conductive channel extending through the plurality of conductive layers, and a plurality of memory cells coupling the plurality of conductive layers to the conductive channel, wherein each word line is associated with one of the plurality of memory cells.

In one example of a flash memory component, the voids are filled with a gas.

In one example of a flash memory component, the gas comprises air, argon, nitrogen, or a combination thereof.

In one example of a flash memory component, the conductive layers are vertically spaced apart from one another by a distance of from about 5 nm to about 50 nm.

In one example of a flash memory component, each of the conductive layers has a thickness of from about 10 nm to about 40 nm.

In one example of a flash memory component, the plurality of conductive layers comprises polysilicon.

In one example of a flash memory component, at least one of the plurality of conductive layers has a SiGe residue on a top surface, a bottom surface, or both.

In one example, a flash memory component comprises a vertically oriented support column extending through, and mechanically coupled with, at least two of the plurality of conductive layers in a staircase region.

In one example of a flash memory component, the support column forms at least a portion of a non-functional memory pillar that is electrically isolated from one or both of a source line and a drain line.

In one example, a flash memory component comprises a plurality of non-functional memory cells adjacent to the non-functional memory pillar and mechanically coupling the non-functional memory pillar to the at least two of the plurality of conductive layers.

In one example, a flash memory component comprises a vertically oriented wall extending through, and mechanically coupled with, the plurality of conductive layers.

In one example of a flash memory component, the vertically oriented wall comprises a dielectric material.

In one example of a flash memory component, each of the plurality of memory cells comprises a charge storage structure.

In one example of a flash memory component, each of the plurality of memory cells further comprises at least one dielectric layer disposed between the word line (e.g. control gate) and the charge storage structure.

In one example of a flash memory component, the at least one dielectric layer comprises a nitride material an oxide material, or a combination thereof.

In one example, a flash memory component comprises a tunnel dielectric layer disposed between the charge storage structure and the conductive channel.

In one example of a flash memory component, the charge storage structure is a floating gate or a charge trap.

In one example of a flash memory component, the conductive channel comprises polysilicon, Ge, SiGe, or a combination thereof.

In one example, there is provided a flash memory component precursor comprising a first plurality of layers formed of a first material vertically spaced apart from one another and separated by a second plurality of layers formed of a second material, wherein the first and second materials have similar etching properties, a vertically oriented opening extending through the first plurality of layers and the second plurality of layers, and a memory cell associated with each of the first plurality of layers.

In one example of a flash memory component precursor, the first and second materials are electrically conductive.

In one example of a flash memory component precursor, the first material comprises polysilicon.

In one example of a flash memory component precursor, the second material comprises SiGe.

In one example of a flash memory component precursor, the first and second materials have an electrical resistivity less than or equal to $2 \times 10^{-3} \Omega \cdot m$.

In one example of a flash memory component precursor, the etching properties of the first and second materials enable etching of holes having aspect ratios greater than 100.

In one example of a flash memory component precursor, each of the second plurality of layers has a thickness of from about 5 nm to about 50 nm.

In one example of a flash memory component precursor, each of the first plurality of layers has a thickness of from about 10 nm to about 40 nm.

In one example, a flash memory component precursor comprises a vertically oriented support column extending through, and mechanically coupled with, at least one of the first plurality of layers in a staircase region.

In one example of a flash memory component precursor, the support column forms at least a portion of a non-functional memory pillar.

In one example of a flash memory component precursor comprises a plurality of non-functional memory cells adjacent to the non-functional memory pillar and mechanically coupling the non-functional memory pillar to the at least one of the first plurality of layers.

In one example, a flash memory component precursor comprises a vertically oriented slot extending through the first plurality of layers and the second plurality of layers.

In one example of a flash memory component precursor, the memory cell comprises a charge storage structure.

In one example of a flash memory component precursor, the memory cell further comprises at least one dielectric layer disposed between the word line (e.g. control gate) and the charge storage structure.

In one example of a flash memory component precursor, the at least one dielectric layer comprises a nitride material an oxide material, or a combination thereof.

In one example, a flash memory component precursor comprises a tunnel dielectric layer disposed on the charge storage structure.

In one example of a flash memory component precursor, the charge storage structure is a floating gate or a charge trap.

In one example, a flash memory component precursor comprises a conductive channel disposed in the vertically oriented opening and extending through the first plurality of layers and the second plurality of layers, wherein the conductive channel is mechanically coupled to the first plurality of layers by the memory cells.

In one example of a flash memory component precursor, the conductive channel comprises polysilicon, Ge, SiGe, or a combination thereof.

In one example, there is provided a solid-state device comprising a printed circuit board (PCB), and a flash memory operably coupled to the PCB. The flash memory component comprises a plurality of conductive layers vertically spaced apart from one another and separated by voids, each of the plurality of conductive layers forming a word line, a vertically oriented conductive channel extending through the plurality of conductive layers, and a plurality of memory cells coupling the plurality of conductive layers to the conductive channel, wherein each word line is associated with one of the plurality of memory cells.

In one example, a solid-state device comprises a memory controller operably coupled to the PCB.

In one example, a solid-state device comprises a data buffer operably coupled to the PCB.

In one example, there is provided a computing system comprising a motherboard, and a flash memory component operably coupled to the motherboard. The flash memory component comprises a plurality of conductive layers vertically spaced apart from one another and separated by voids, each of the plurality of conductive layers forming a word line, a vertically oriented conductive channel extending through the plurality of conductive layers, and a plurality of memory cells coupling the plurality of conductive layers to the conductive channel, wherein each word line is associated with one of the plurality of memory cells.

In one example of a computing system, the computing system comprises a desktop computer, a laptop, a tablet, a smartphone, a wearable device, a server, or a combination thereof.

In one example of a computing system, the computing system further comprises a processor, a memory device, a heat sink, a radio, a slot, a port, or a combination thereof operably coupled to the motherboard.

In one example there is provided a method for making a flash memory component comprising forming alternating layers of a first material and a second material such that a first plurality of layers of the first material are vertically spaced apart from one another and separated by a second plurality of layers of the second material, wherein the first and second materials have similar etching properties, forming a vertically oriented opening extending through the first plurality of layers and the second plurality of layers, and forming a memory cell associated with each of the first plurality of layers.

In one example of a method for making a flash memory component, forming alternating layers of the first material and the second material comprises a deposition process.

In one example of a method for making a flash memory component, the first and second materials are electrically conductive.

In one example of a method for making a flash memory component, the first material comprises polysilicon.

In one example of a method for making a flash memory component, the second material comprises SiGe.

In one example of a method for making a flash memory component, the first and second materials have an electrical resistivity less than or equal to $2\times10^{-3}\Omega\cdot m$.

In one example of a method for making a flash memory component, the etching properties of the first and second materials enable etching of holes having aspect ratios greater than 100.

In one example of a method for making a flash memory component, each of the second plurality of layers has a thickness of from about 5 nm to about 50 nm.

In one example of a method for making a flash memory component, each of the first plurality of layers has a thickness of from about 10 nm to about 40 nm.

In one example of a method for making a flash memory component, forming the vertically oriented opening comprises an etching process.

In one example of a method for making a flash memory component, the etching process comprises a flourocarbon plasma etching process.

In one example of a method for making a flash memory component, the flourocarbon plasma etching process comprises a $C_4F_8/Ar/N_2$ gas mixture.

In one example of a method for making a flash memory component, forming the memory cell comprises forming recesses from the vertically oriented opening into the first plurality of layers such that the recesses are defined by the first material of the first plurality of layers and the second material of the second plurality of layers.

In one example of a method for making a flash memory component, forming the recesses comprises an etching process.

In one example of a method for making a flash memory component, the etching process comprises a wet etching process.

In one example of a method for making a flash memory component, the wet etching process comprises tetramethylammonium hydroxide (TMAH).

In one example of a method for making a flash memory component, forming the memory cell further comprises forming a dielectric layer in the recesses.

In one example of a method for making a flash memory component, forming the dielectric layer comprises oxidizing the first material and the second material defining the recesses.

In one example of a method for making a flash memory component, forming the dielectric layer comprises depositing dielectric material on the first material and the second material defining the recesses.

In one example of a method for making a flash memory component, the memory cell comprises a charge storage structure.

In one example of a method for making a flash memory component, the memory cell further comprises at least one dielectric layer disposed between the word line (e.g. control gate) and the charge storage structure.

In one example of a method for making a flash memory component, the at least one dielectric layer comprises a nitride material an oxide material, or a combination thereof.

In one example, a method for making a flash memory component comprises forming a tunnel dielectric layer on the charge storage structure.

In one example of a method for making a flash memory component, the charge storage structure is a floating gate or a charge trap.

In one example, a method for making a flash memory component comprises forming a vertically oriented slot extending through the first plurality of layers and the second plurality of layers.

In one example of a method for making a flash memory component, forming the vertically oriented slot comprises an etching process.

In one example of a method for making a flash memory component, the etching process comprises a flourocarbon plasma etching process.

In one example of a method for making a flash memory component, the flourocarbon plasma etching process comprises a $C_4F_8/Ar/N_2$ gas mixture.

In one example, a method for making a flash memory component comprises forming a conductive channel in the vertically oriented opening and extending through the first plurality of layers and the second plurality of layers, wherein the conductive channel is mechanically coupled to the first plurality of layers by the memory cells.

In one example of a method for making a flash memory component, the conductive channel comprises polysilicon, Ge, SiGe, or a combination thereof.

In one example of a method for making a flash memory component comprises removing the second plurality of layers.

In one example of a method for making a flash memory component, removing the second plurality of layers comprises an etching process.

In one example of a method for making a flash memory component, etchant accesses the second plurality of layers through the vertically oriented slot.

In one example of a method for making a flash memory component, the etching process comprises a dry etching process.

In one example of a method for making a flash memory component, the dry etching process comprises a ClF3 dry etching process.

In one example of a method for making a flash memory component, each of the first plurality of layers has a thickness of from about 10 nm to about 40 nm.

In one example, a method for making a flash memory component comprises reducing the thickness of each of the first plurality of layers to about 5 nm to about 35 nm.

In one example of a method for making a flash memory component, reducing the thickness of each of the first plurality of layers comprises an etching process.

In one example, a method for making a flash memory component comprises disposing a wall material in the vertically oriented slot to form a wall extending through, and mechanically coupled with, the first plurality of layers.

In one example, a method for making a flash memory component, the wall material comprises a dielectric material.

In one example, a method for making a flash memory component comprises forming the first plurality of layers into a series of steps in a staircase region.

In one example of a method for making a flash memory component, forming the first plurality of layers into the series of steps comprises an etching process.

In one example of a method for making a flash memory component, the etching process comprises a reactive-ion etching (RIE) etching process.

In one example, a method for making a flash memory component comprises forming a vertically oriented support column extending through, and mechanically coupled with, at least one of the first plurality of layers and at least one of the second plurality of layers in the staircase region.

In one example of a method for making a flash memory component, forming the vertically oriented support column comprises forming a vertically oriented support column opening extending through the at least one of the first plurality of layers and the at least one of the second plurality of layers in the staircase region, and disposing a support column material in the vertically oriented support column opening.

In one example of a method for making a flash memory component, forming the vertically oriented support column opening comprises an etching process.

In one example of a method for making a flash memory component, the etching process comprises a flourocarbon plasma etching process.

In one example of a method for making a flash memory component, the flourocarbon plasma etching process comprises a $C_4F_8/Ar/N_2$ gas mixture.

In one example of a method for making a flash memory component, the support column forms at least a portion of a non-functional memory pillar.

In one example, a method for making a flash memory component comprises forming a plurality of non-functional memory cells in the staircase region, wherein the non-functional memory pillar is adjacent to the plurality of non-functional memory cells and mechanically coupled to the at least one of the first plurality of layers by the plurality of non-functional memory cells.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:
1. A flash memory component, comprising:
    a plurality of conductive layers vertically spaced apart from one another and separated by voids, each of the plurality of conductive layers forming a word line and having a height in a vertical direction;

a vertically oriented conductive channel extending through the plurality of conductive layers, wherein the voids provide a vacuum insulating medium between wordlines corresponding to the plurality of conductive layers;

a plurality of memory cells coupling the plurality of conductive layers to the conductive channel, wherein each word line is associated with one of the plurality of memory cells, each of the memory cells including a charge storage structure having a height in the vertical direction smaller than the height of a corresponding polysilicon conductive layer and protruding in a direction away from the conductive channel, and a blocking dielectric layer conformal to and adjacent to the charge storage structure, wherein charge storage structures of respective ones of the memory cells are distinct from one another, and blocking dielectric layers of respective ones of the memory cells are distinct from one another; and a vertically oriented support column in a staircase region of the plurality of conductive layers, the vertically oriented support column extending through, and mechanically coupled with, at least two of the plurality of conductive layers, wherein the plurality of conductive layers comprises polysilicon, and wherein at least one of the plurality of conductive layers has a SiGe residue on a top surface, a bottom surface, or both.

2. The flash memory component of claim 1, wherein the conductive layers are vertically spaced apart from one another by a distance of from about 5 nm to about 50 nm.

3. The flash memory component of claim 1, wherein each of the conductive layers has a thickness of from about 10 nm to about 40 nm.

4. The flash memory component of claim 1, wherein the support column forms at least a portion of a non-functional memory pillar that is electrically isolated from one or both of a source line and a drain line.

5. The flash memory component of claim 4, further comprising a plurality of non-functional memory cells adjacent to the non-functional memory pillar and mechanically coupling the non-functional memory pillar to the at least two of the plurality of conductive layers.

6. The flash memory component of claim 1, further comprising a vertically oriented wall extending through, and mechanically coupled with, the plurality of conductive layers.

7. The flash memory component of claim 6, wherein the vertically oriented wall comprises a dielectric material.

8. The flash memory component of claim 1, further including a tunnel dielectric layer extending along the conductive channel and disposed between the charge storage structure and the blocking dielectric layer of each of the memory cells, wherein the charge storage structure of each of the memory cells has a surface adjacent to the tunnel dielectric layer and remaining surfaces conformally covered by a corresponding blocking dielectric layer.

9. The flash memory component of claim 8, wherein the blocking dielectric layer of each of the memory cells is a first blocking dielectric layer, the flash memory component further comprising a second blocking dielectric layer extending in a direction of the conductive channel between the conductive layers and corresponding first blocking dielectric layers.

10. The flash memory component of claim 9, wherein the at least one of the first blocking dielectric layer or the second blocking dielectric layers comprises a nitride material, an oxide material, or a combination thereof.

11. The flash memory component of claim 8, wherein the charge storage structure is a floating gate or a charge trap.

12. The flash memory component of claim 1, wherein the conductive channel comprises polysilicon, Ge, SiGe, or a combination thereof.

13. A flash memory component, comprising:

a plurality of polysilicon conductive layers vertically spaced apart from one another and separated by voids, each of the plurality of polysilicon conductive layers forming a word line and having a height in a vertical direction, wherein at least one of the plurality of polysilicon conductive layers has a SiGe residue on a top surface, a bottom surface, or both, wherein the voids provide a vacuum insulating medium between wordlines corresponding to the plurality of conductive layers;

a vertically oriented conductive channel extending through the plurality of polysilicon conductive layers; and a plurality of memory cells coupling the plurality of polysilicon conductive layers to the conductive channel, wherein each word line is associated with one of the memory cells, each of the memory cells including a charge storage structure having a height in the vertical direction smaller than the height of a corresponding polysilicon conductive layer and protruding in a direction away from the conductive channel, and a blocking dielectric layer conformal to and adjacent to the charge storage structure, wherein charge storage structures of respective ones of the memory cells are distinct from one another, and blocking dielectric layers of respective ones of the memory cells are distinct from one another.

* * * * *